United States Patent
Kutz et al.

(10) Patent No.: US 11,683,055 B1
(45) Date of Patent: Jun. 20, 2023

(54) OVER THE AIR DPD FOR CV2X GROUPCAST AND UNICAST

(71) Applicant: QUALCOMM Incorporated, San Diego, CA (US)

(72) Inventors: Gideon Shlomo Kutz, Ramat Hasharon (IL); Shay Landis, Hod Hasharon (IL); Idan Michael Horn, Hod Hasharon (IL); Yehonatan Dallal, Kfar Saba (IL)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 17/457,886

(22) Filed: Dec. 6, 2021

(51) Int. Cl.
| | | |
|---|---|---|
| *H04B 1/04* | (2006.01) | |
| *H03F 1/32* | (2006.01) | |
| *H04W 4/06* | (2009.01) | |
| *H04W 72/20* | (2023.01) | |
| *H04L 5/00* | (2006.01) | |

(52) U.S. Cl.
CPC ......... *H04B 1/0475* (2013.01); *H03F 1/3247* (2013.01); *H04W 4/06* (2013.01); *H04W 72/20* (2023.01); *H04L 5/0048* (2013.01)

(58) Field of Classification Search
CPC .......... H04B 1/0475; H04B 2001/0425; H04B 1/62; H04B 1/04; H04B 1/0064; H04B 1/0483; H04B 2001/0433; H04B 1/0458; H04W 88/085; H04W 24/02; H04W 84/047; H04W 88/08; H04W 48/16; H04W 52/0203; H04W 52/0206; H04W 52/0216; H03F 1/3247; H03F 1/3258; H03F 3/24; H03F 2200/451; H03F 2201/3224; H03F 1/3241; H03F 2201/3209; H03F 1/26; H04J 11/0023; H04J 11/0093
USPC ...................................................... 375/297
See application file for complete search history.

(56) References Cited

U.S. PATENT DOCUMENTS

| | | | |
|---|---|---|---|
| 9,337,782 B1* | 5/2016 | Mauer | H04L 25/03343 |
| 11,296,735 B1* | 4/2022 | Kutz | H04B 1/0475 |
| 2018/0076847 A1* | 3/2018 | Ju | H04L 25/0224 |
| 2021/0273667 A1* | 9/2021 | Lv | H04B 7/0417 |

* cited by examiner

*Primary Examiner* — Eva Y Puente
(74) *Attorney, Agent, or Firm* — Procopio, Cory, Hargreaves & Savitch LLP

(57) ABSTRACT

A first UE may transmit, to a second subset of one or more second UEs, one or more pilot signals associated with DPD training. The first UE may receive, from a third subset of the one or more second UEs, one or more feedback messages associated with DPD training. The one or more feedback messages may be based on the one or more pilot signals. Each second UE in the third subset of the one or more second UEs may correspond to one of the one or more feedback messages. The second UE may calculate one or more DPD parameters based on the one or more feedback messages. The second UE may transmit a first signal based on the calculated one or more DPD parameters.

30 Claims, 12 Drawing Sheets

US 11,683,055 B1

OVER THE AIR DPD FOR CV2X GROUPCAST AND UNICAST

TECHNICAL FIELD

The present disclosure relates generally to communication systems, and more particularly, to power amplifier (PA) non-linearity correction in a device-to-device (D2D) wireless communication system.

INTRODUCTION

Wireless communication systems are widely deployed to provide various telecommunication services such as telephony, video, data, messaging, and broadcasts. Typical wireless communication systems may employ multiple-access technologies capable of supporting communication with multiple users by sharing available system resources. Examples of such multiple-access technologies include code division multiple access (CDMA) systems, time division multiple access (TDMA) systems, frequency division multiple access (FDMA) systems, orthogonal frequency division multiple access (OFDMA) systems, single-carrier frequency division multiple access (SC-FDMA) systems, and time division synchronous code division multiple access (TD-SCDMA) systems.

These multiple access technologies have been adopted in various telecommunication standards to provide a common protocol that enables different wireless devices to communicate on a municipal, national, regional, and even global level. An example telecommunication standard is 5G New Radio (NR). 5G NR is part of a continuous mobile broadband evolution promulgated by Third Generation Partnership Project (3GPP) to meet new requirements associated with latency, reliability, security, scalability (e.g., with Internet of Things (IoT)), and other requirements. 5G NR includes services associated with enhanced mobile broadband (eMBB), massive machine type communications (mMTC), and ultra-reliable low latency communications (URLLC). Some aspects of 5G NR may be based on the 4G Long Term Evolution (LTE) standard. There exists a need for further improvements in 5G NR technology. These improvements may also be applicable to other multi-access technologies and the telecommunication standards that employ these technologies.

BRIEF SUMMARY

The following presents a simplified summary of one or more aspects in order to provide a basic understanding of such aspects. This summary is not an extensive overview of all contemplated aspects, and is intended to neither identify key or critical elements of all aspects nor delineate the scope of any or all aspects. Its sole purpose is to present some concepts of one or more aspects in a simplified form as a prelude to the more detailed description that is presented later.

In an aspect of the disclosure, a method, a computer-readable medium, and an apparatus are provided. The apparatus may be a first user equipment (UE). The apparatus may transmit, to a second subset of one or more second UEs, one or more pilot signals associated with digital pre-distortion (DPD) training. The apparatus may receive, from a third subset of the one or more second UEs, one or more feedback messages associated with DPD training. The one or more feedback messages may be based on the one or more pilot signals. Each second UE in the third subset of the one or more second UEs may correspond to one of the one or more feedback messages. The apparatus may calculate one or more DPD parameters based on the one or more feedback messages. The apparatus may transmit a first signal based on the calculated one or more DPD parameters.

In an aspect of the disclosure, a method, a computer-readable medium, and an apparatus are provided. The apparatus may be a second UE. The apparatus may receive, from at least one first UE via a second broadcast message, a DPD training request message. The apparatus may transmit, to the at least one first UE, a request acknowledgement message. The apparatus may receive, from the at least one first UE, one or more pilot signals associated with DPD training. The apparatus may transmit, to the at least one first UE, a feedback message associated with DPD training based on the one or more pilot signals.

To the accomplishment of the foregoing and related ends, the one or more aspects comprise the features hereinafter fully described and particularly pointed out in the claims. The following description and the annexed drawings set forth in detail certain illustrative features of the one or more aspects. These features are indicative, however, of but a few of the various ways in which the principles of various aspects may be employed, and this description is intended to include all such aspects and their equivalents.

DETAILED DESCRIPTION

Figure 1:
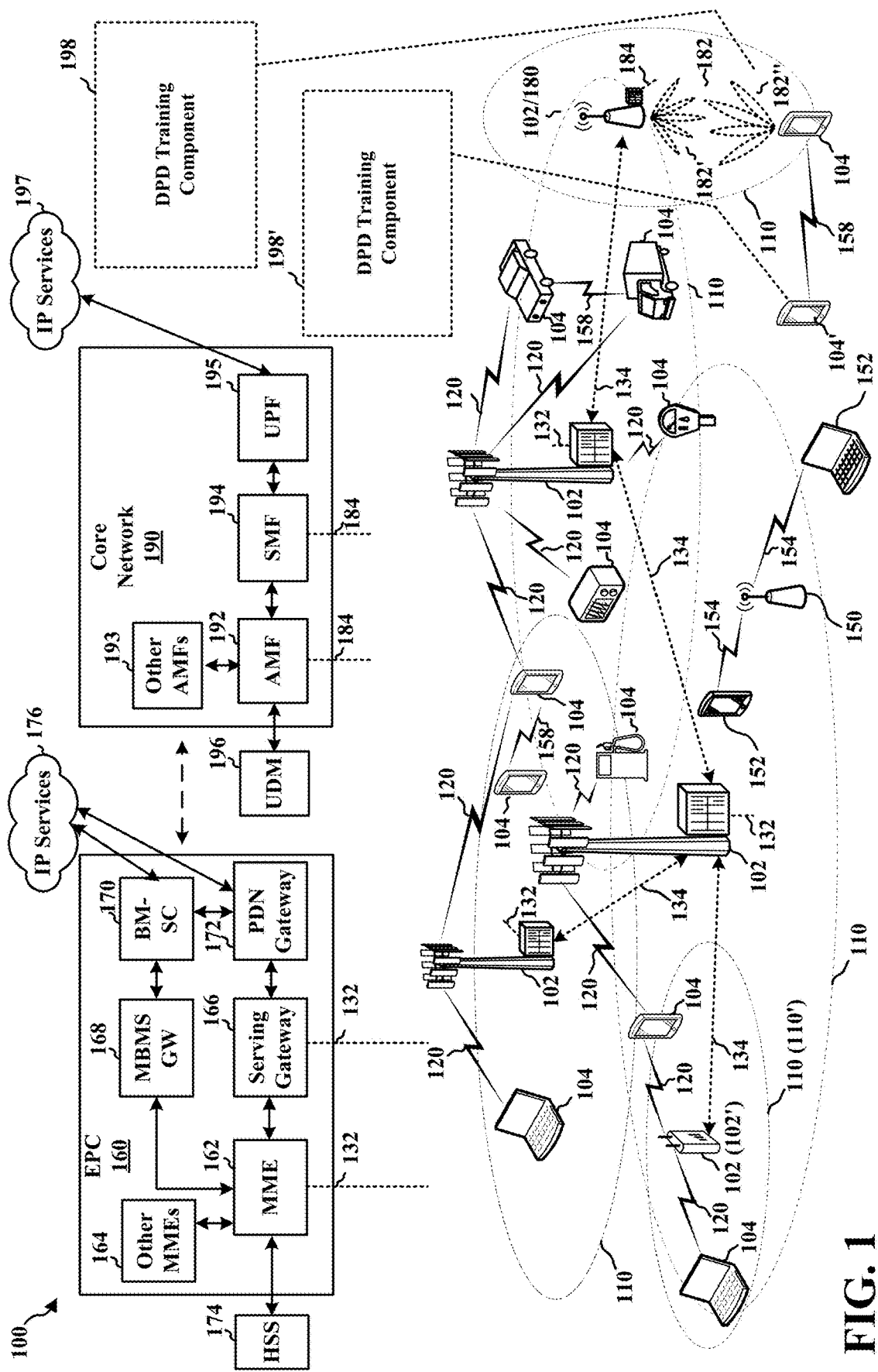
FIG. 1 is a diagram illustrating an example of a wireless communications system and an access network.

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts.

Several aspects of telecommunication systems will now be presented with reference to various apparatus and methods. These apparatus and methods will be described in the following detailed description and illustrated in the accompanying drawings by various blocks, components, circuits, processes, algorithms, etc. (collectively referred to as "elements"). These elements may be implemented using electronic hardware, computer software, or any combination thereof. Whether such elements are implemented as hardware or software depends upon the particular application and design constraints imposed on the overall system.

By way of example, an element, or any portion of an element, or any combination of elements may be implemented as a "processing system" that includes one or more processors. Examples of processors include microprocessors, microcontrollers, graphics processing units (GPUs), central processing units (CPUs), application processors, digital signal processors (DSPs), reduced instruction set computing (RISC) processors, systems on a chip (SoC), baseband processors, field programmable gate arrays (FPGAs), programmable logic devices (PLDs), state machines, gated logic, discrete hardware circuits, and other suitable hardware configured to perform the various functionality described throughout this disclosure. One or more processors in the processing system may execute software. Software shall be construed broadly to mean instructions, instruction sets, code, code segments, program code, programs, subprograms, software components, applications, software applications, software packages, routines, subroutines, objects, executables, threads of execution, procedures, functions, etc., whether referred to as software, firmware, middleware, microcode, hardware description language, or otherwise.

Accordingly, in one or more example embodiments, the functions described may be implemented in hardware, software, or any combination thereof. If implemented in software, the functions may be stored on or encoded as one or more instructions or code on a computer-readable medium. Computer-readable media includes computer storage media. Storage media may be any available media that can be accessed by a computer. By way of example, and not limitation, such computer-readable media can comprise a random-access memory (RAM), a read-only memory (ROM), an electrically erasable programmable ROM (EEPROM), optical disk storage, magnetic disk storage, other magnetic storage devices, combinations of the types of computer-readable media, or any other medium that can be used to store computer executable code in the form of instructions or data structures that can be accessed by a computer.

While aspects and implementations are described in this application by illustration to some examples, those skilled in the art will understand that additional implementations and use cases may come about in many different arrangements and scenarios. Innovations described herein may be implemented across many differing platform types, devices, systems, shapes, sizes, and packaging arrangements. For example, implementations and/or uses may come about via integrated chip implementations and other non-module-component based devices (e.g., end-user devices, vehicles, communication devices, computing devices, industrial equipment, retail/purchasing devices, medical devices, artificial intelligence (AI)-enabled devices, etc.). While some examples may or may not be specifically directed to use cases or applications, a wide assortment of applicability of described innovations may occur. Implementations may range a spectrum from chip-level or modular components to non-modular, non-chip-level implementations and further to aggregate, distributed, or original equipment manufacturer (OEM) devices or systems incorporating one or more aspects of the described innovations. In some practical settings, devices incorporating described aspects and features may also include additional components and features for implementation and practice of claimed and described aspect. For example, transmission and reception of wireless signals necessarily includes a number of components for analog and digital purposes (e.g., hardware components including antenna, RF-chains, power amplifiers, modulators, buffer, processor(s), interleaver, adders/summers, etc.). It is intended that innovations described herein may be practiced in a wide variety of devices, chip-level components, systems, distributed arrangements, aggregated or disaggregated components, end-user devices, etc. of varying sizes, shapes, and constitution.

FIG. 1 is a diagram illustrating an example of a wireless communications system and an access network 100. The wireless communications system (also referred to as a wireless wide area network (WWAN)) includes base stations 102, UEs 104, an Evolved Packet Core (EPC) 160, and another core network 190 (e.g., a 5G Core (5GC)). The base stations 102 may include macrocells (high power cellular base station) and/or small cells (low power cellular base station). The macrocells include base stations. The small cells include femtocells, picocells, and microcells.

The base stations 102 configured for 4G LTE (collectively referred to as Evolved Universal Mobile Telecommunications System (UMTS) Terrestrial Radio Access Network (E-UTRAN)) may interface with the EPC 160 through first backhaul links 132 (e.g., S1 interface). The base stations 102 configured for 5G NR (collectively referred to as Next Generation RAN (NG-RAN)) may interface with core network 190 through second backhaul links 184. In addition to other functions, the base stations 102 may perform one or more of the following functions: transfer of user data, radio channel ciphering and deciphering, integrity protection, header compression, mobility control functions (e.g., handover, dual connectivity), inter-cell interference coordination, connection setup and release, load balancing, distribution for non-access stratum (NAS) messages, NAS node selection, synchronization, radio access network (RAN) sharing, multimedia broadcast multicast service (MBMS), subscriber and equipment trace, RAN information management (RIM), paging, positioning, and delivery of warning messages. The base stations 102 may communicate directly or indirectly (e.g., through the EPC 160 or core network 190) with each other over third backhaul links 134 (e.g., X2 interface). The first backhaul links 132, the second backhaul links 184, and the third backhaul links 134 may be wired or wireless.

The base stations 102 may wirelessly communicate with the UEs 104. Each of the base stations 102 may provide communication coverage for a respective geographic coverage area 110. There may be overlapping geographic coverage areas 110. For example, the small cell 102' may have a coverage area 110' that overlaps the coverage area 110 of one or more macro base stations 102. A network that includes both small cell and macrocells may be known as a heterogeneous network. A heterogeneous network may also include Home Evolved Node Bs (eNBs) (HeNBs), which may provide service to a restricted group known as a closed subscriber group (CSG). The communication links 120 between the base stations 102 and the UEs 104 may include uplink (UL) (also referred to as reverse link) transmissions from a UE 104 to a base station 102 and/or downlink (DL) (also referred to as forward link) transmissions from a base station 102 to a UE 104. The communication links 120 may use multiple-input and multiple-output (MIMO) antenna technology, including spatial multiplexing, beamforming, and/or transmit diversity. The communication links may be through one or more carriers. The base stations 102/UEs 104 may use spectrum up to Y MHz (e.g., 5, 10, 15, 20, 100, 400, etc. MHz) bandwidth per carrier allocated in a carrier aggregation of up to a total of Yx MHz (x component carriers) used for transmission in each direction. The carriers may or may not be adjacent to each other. Allocation of carriers may be asymmetric with respect to DL and UL (e.g., more or fewer carriers may be allocated for DL than for UL). The component carriers may include a primary component carrier and one or more secondary component carriers. A primary component carrier may be referred to as a primary cell (PCell) and a secondary component carrier may be referred to as a secondary cell (SCell).

Certain UEs 104 may communicate with each other using device-to-device (D2D) communication link 158. The D2D communication link 158 may use the DL/UL WWAN spectrum. The D2D communication link 158 may use one or more sidelink channels, such as a physical sidelink broadcast channel (PSBCH), a physical sidelink discovery channel (PSDCH), a physical sidelink shared channel (PSSCH), and a physical sidelink control channel (PSCCH). D2D communication may be through a variety of wireless D2D communications systems, such as for example, WiMedia, Bluetooth, ZigBee, Wi-Fi based on the Institute of Electrical and Electronics Engineers (IEEE) 802.11 standard, LTE, or NR.

The wireless communications system may further include a Wi-Fi access point (AP) 150 in communication with Wi-Fi stations (STAs) 152 via communication links 154, e.g., in a 5 GHz unlicensed frequency spectrum or the like. When communicating in an unlicensed frequency spectrum, the STAs 152/AP 150 may perform a clear channel assessment (CCA) prior to communicating in order to determine whether the channel is available.

The small cell 102' may operate in a licensed and/or an unlicensed frequency spectrum. When operating in an unlicensed frequency spectrum, the small cell 102' may employ NR and use the same unlicensed frequency spectrum (e.g., 5 GHz, or the like) as used by the Wi-Fi AP 150. The small cell 102', employing NR in an unlicensed frequency spectrum, may boost coverage to and/or increase capacity of the access network.

The electromagnetic spectrum is often subdivided, based on frequency/wavelength, into various classes, bands, channels, etc. In 5G NR, two initial operating bands have been identified as frequency range designations FR1 (410 MHz-7.125 GHz) and FR2 (24.25 GHz-52.6 GHz). Although a portion of FR1 is greater than 6 GHz, FR1 is often referred to (interchangeably) as a "sub-6 GHz" band in various documents and articles. A similar nomenclature issue sometimes occurs with regard to FR2, which is often referred to (interchangeably) as a "millimeter wave" band in documents and articles, despite being different from the extremely high frequency (EHF) band (30 GHz-300 GHz) which is identified by the International Telecommunications Union (ITU) as a "millimeter wave" band.

The frequencies between FR1 and FR2 are often referred to as mid-band frequencies. Recent 5G NR studies have identified an operating band for these mid-band frequencies as frequency range designation FR3 (7.125 GHz-24.25 GHz). Frequency bands falling within FR3 may inherit FR1 characteristics and/or FR2 characteristics, and thus may effectively extend features of FR1 and/or FR2 into mid-band frequencies. In addition, higher frequency bands are currently being explored to extend 5G NR operation beyond 52.6 GHz. For example, three higher operating bands have been identified as frequency range designations FR2-2 (52.6 GHz-71 GHz), FR4 (71 GHz-114.25 GHz), and FR5 (114.25 GHz-300 GHz). Each of these higher frequency bands falls within the EHF band.

With the above aspects in mind, unless specifically stated otherwise, it should be understood that the term "sub-6 GHz" or the like if used herein may broadly represent frequencies that may be less than 6 GHz, may be within FR1, or may include mid-band frequencies. Further, unless specifically stated otherwise, it should be understood that the term "millimeter wave" or the like if used herein may broadly represent frequencies that may include mid-band frequencies, may be within FR2, FR4, FR2-2, and/or FR5, or may be within the EHF band.

A base station 102, whether a small cell 102' or a large cell (e.g., macro base station), may include and/or be referred to as an eNB, gNodeB (gNB), or another type of base station. Some base stations, such as gNB 180 may operate in a traditional sub 6 GHz spectrum, in millimeter wave frequencies, and/or near millimeter wave frequencies in communication with the UE 104. When the gNB 180 operates in millimeter wave or near millimeter wave frequencies, the gNB 180 may be referred to as a millimeter wave base station. The millimeter wave base station 180 may utilize beamforming 182 with the UE 104 to compensate for the path loss and short range. The base station 180 and the UE 104 may each include a plurality of antennas, such as antenna elements, antenna panels, and/or antenna arrays to facilitate the beamforming.

The base station 180 may transmit a beamformed signal to the UE 104 in one or more transmit directions 182'. The UE 104 may receive the beamformed signal from the base station 180 in one or more receive directions 182". The UE 104 may also transmit a beamformed signal to the base station 180 in one or more transmit directions. The base station 180 may receive the beamformed signal from the UE 104 in one or more receive directions. The base station 180/UE 104 may perform beam training to determine the best receive and transmit directions for each of the base station 180/UE 104. The transmit and receive directions for the base station 180 may or may not be the same. The transmit and receive directions for the UE 104 may or may not be the same.

The EPC 160 may include a Mobility Management Entity (MME) 162, other MMEs 164, a Serving Gateway 166, a Multimedia Broadcast Multicast Service (MBMS) Gateway 168, a Broadcast Multicast Service Center (BM-SC) 170, and a Packet Data Network (PDN) Gateway 172. The MME 162 may be in communication with a Home Subscriber Server (HSS) 174. The MME 162 is the control node that processes the signaling between the UEs 104 and the EPC 160. Generally, the MME 162 provides bearer and connection management. All user Internet protocol (IP) packets are transferred through the Serving Gateway 166, which itself is connected to the PDN Gateway 172. The PDN Gateway 172 provides UE IP address allocation as well as other functions. The PDN Gateway 172 and the BM-SC 170 are connected to the IP Services 176. The IP Services 176 may include the Internet, an intranet, an IP Multimedia Subsystem (IMS), a PS Streaming Service, and/or other IP services. The BM-SC 170 may provide functions for MBMS user service provisioning and delivery. The BM-SC 170 may serve as an entry point for content provider MBMS transmission, may be used to authorize and initiate MBMS Bearer Services within a public land mobile network (PLMN), and may be used to schedule MBMS transmissions. The MBMS Gateway 168 may be used to distribute MBMS traffic to the base stations 102 belonging to a Multicast Broadcast Single Frequency Network (MBSFN) area broadcasting a particular service, and may be responsible for session management (start/stop) and for collecting eMBMS related charging information.

The core network 190 may include an Access and Mobility Management Function (AMF) 192, other AMFs 193, a Session Management Function (SMF) 194, and a User Plane Function (UPF) 195. The AMF 192 may be in communication with a Unified Data Management (UDM) 196. The AMF 192 is the control node that processes the signaling between the UEs 104 and the core network 190. Generally, the AMF 192 provides QoS flow and session management. All user Internet protocol (IP) packets are transferred through the UPF 195. The UPF 195 provides UE IP address allocation as well as other functions. The UPF 195 is connected to the IP Services 197. The IP Services 197 may include the Internet, an intranet, an IP Multimedia Subsystem (IMS), a Packet Switch (PS) Streaming (PSS) Service, and/or other IP services.

The base station may include and/or be referred to as a gNB, Node B, eNB, an access point, a base transceiver station, a radio base station, a radio transceiver, a transceiver function, a basic service set (BSS), an extended service set (ESS), a transmit reception point (TRP), or some other suitable terminology. The base station 102 provides an access point to the EPC 160 or core network 190 for a UE 104. Examples of UEs 104 include a cellular phone, a smart phone, a session initiation protocol (SIP) phone, a laptop, a personal digital assistant (PDA), a satellite radio, a global positioning system, a multimedia device, a video device, a digital audio player (e.g., MP3 player), a camera, a game console, a tablet, a smart device, a wearable device, a vehicle, an electric meter, a gas pump, a large or small kitchen appliance, a healthcare device, an implant, a sensor/actuator, a display, or any other similar functioning device. Some of the UEs 104 may be referred to as IoT devices (e.g., parking meter, gas pump, toaster, vehicles, heart monitor, etc.). The UE 104 may also be referred to as a station, a mobile station, a subscriber station, a mobile unit, a subscriber unit, a wireless unit, a remote unit, a mobile device, a wireless device, a wireless communications device, a remote device, a mobile subscriber station, an access terminal, a mobile terminal, a wireless terminal, a remote terminal, a handset, a user agent, a mobile client, a client, or some other suitable terminology. In some scenarios, the term UE may also apply to one or more companion devices such as in a device constellation arrangement. One or more of these devices may collectively access the network and/or individually access the network.

Referring again to FIG. 1, in certain aspects, the first UE 104 may include a DPD training component 198 that may be configured to transmit, to a second subset of one or more second UEs, one or more pilot signals associated with DPD training. The DPD training component 198 may be configured to receive, from a third subset of the one or more second UEs, one or more feedback messages associated with DPD training. The one or more feedback messages may be based on the one or more pilot signals. Each second UE in the third subset of the one or more second UEs may correspond to one of the one or more feedback messages. The DPD training component 198 may be configured to calculate one or more DPD parameters based on the one or more feedback messages. The DPD training component 198 may be configured to transmit a first signal based on the calculated one or more DPD parameters. In certain aspects, the second UE 104' may include a DPD training component 198' that may be configured to receive, from at least one first UE via a second broadcast message, a DPD training request message. The DPD training component 198' may be configured to transmit, to the at least one first UE, a request acknowledgement message. The DPD training component 198' may be configured to receiving, from the at least one first UE, one or more pilot signals associated with DPD training. The DPD training component 198' may be configured to transmit, to the at least one first UE, a feedback message associated with DPD training based on the one or more pilot signals. Although the following description may be focused on 5G NR, the concepts described herein may be applicable to other similar areas, such as LTE, LTE-A, CDMA, GSM, and other wireless technologies.

Figure 2:
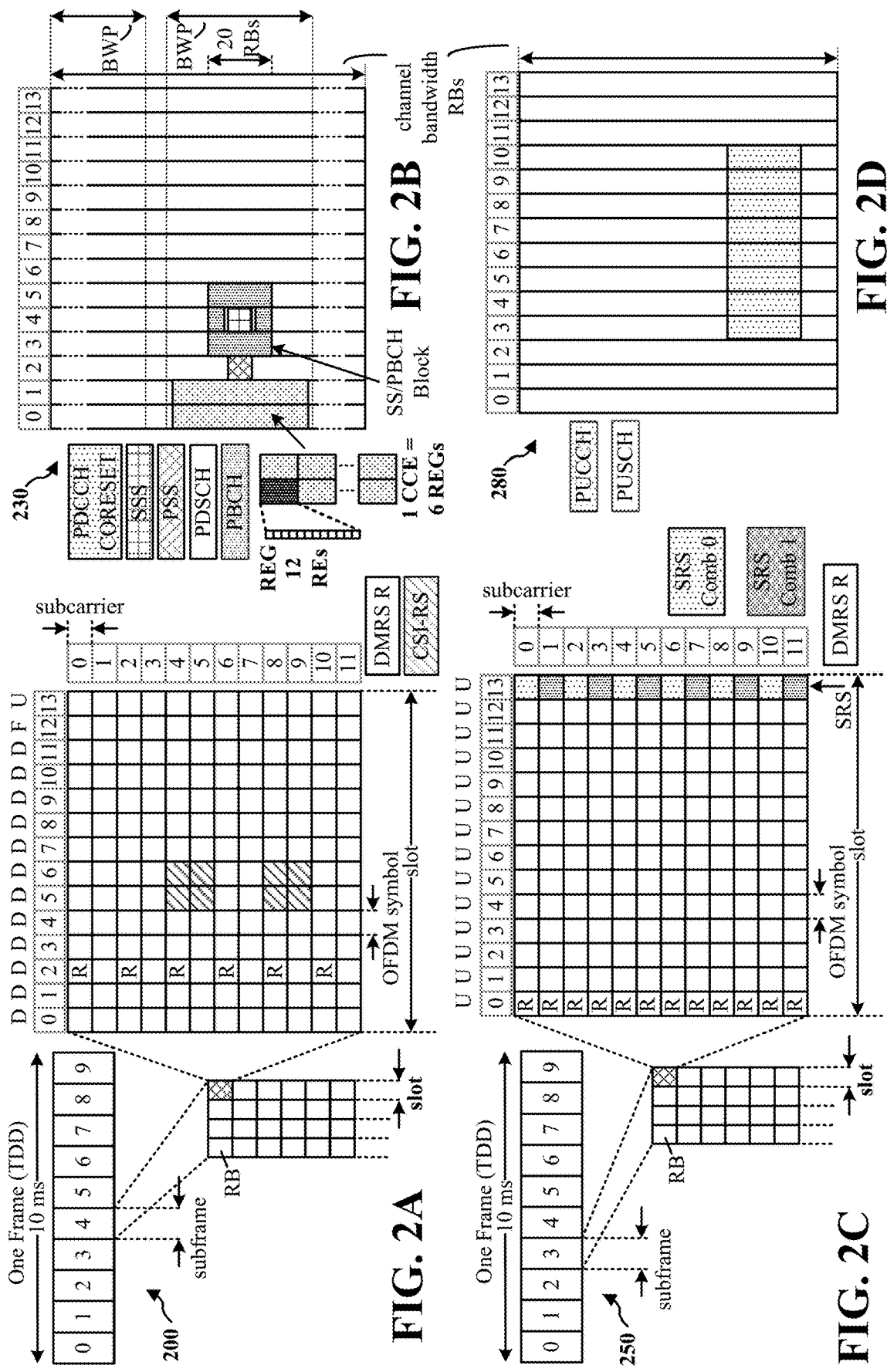
FIG. 2A is a diagram illustrating an example of a first frame, in accordance with various aspects of the present disclosure.
FIG. 2B is a diagram illustrating an example of DL channels within a subframe, in accordance with various aspects of the present disclosure.
FIG. 2C is a diagram illustrating an example of a second frame, in accordance with various aspects of the present disclosure.
FIG. 2D is a diagram illustrating an example of UL channels within a subframe, in accordance with various aspects of the present disclosure.

FIG. 2A is a diagram 200 illustrating an example of a first subframe within a 5G NR frame structure. FIG. 2B is a diagram 230 illustrating an example of DL channels within a 5G NR subframe. FIG. 2C is a diagram 250 illustrating an example of a second subframe within a 5G NR frame structure. FIG. 2D is a diagram 280 illustrating an example of UL channels within a 5G NR subframe. The 5G NR frame structure may be frequency division duplexed (FDD) in which for a particular set of subcarriers (carrier system bandwidth), subframes within the set of subcarriers are dedicated for either DL or UL, or may be time division duplexed (TDD) in which for a particular set of subcarriers (carrier system bandwidth), subframes within the set of subcarriers are dedicated for both DL and UL. In the examples provided by FIGS. 2A, 2C, the 5G NR frame structure is assumed to be TDD, with subframe 4 being configured with slot format 28 (with mostly DL), where D is DL, U is UL, and F is flexible for use between DL/UL, and subframe 3 being configured with slot format 1 (with all UL). While subframes 3, 4 are shown with slot formats 1, 28, respectively, any particular subframe may be configured with any of the various available slot formats 0-61. Slot formats 0, 1 are all DL, UL, respectively. Other slot formats 2-61 include a mix of DL, UL, and flexible symbols. UEs are configured with the slot format (dynamically through DL control information (DCI), or semi-statically/statically through radio resource control (RRC) signaling) through a received slot format indicator (SFI). Note that the description infra applies also to a 5G NR frame structure that is TDD.

FIGS. 2A-2D illustrate a frame structure, and the aspects of the present disclosure may be applicable to other wireless communication technologies, which may have a different frame structure and/or different channels. A frame (10 ms) may be divided into 10 equally sized subframes (1 ms). Each subframe may include one or more time slots. Subframes may also include mini-slots, which may include 7, 4, or 2 symbols. Each slot may include 14 or 12 symbols, depending on whether the cyclic prefix (CP) is normal or extended. For normal CP, each slot may include 14 symbols, and for extended CP, each slot may include 12 symbols. The symbols on DL may be CP orthogonal frequency division multiplexing (OFDM) (CP-OFDM) symbols. The symbols on UL may be CP-OFDM symbols (for high throughput scenarios) or discrete Fourier transform (DFT) spread OFDM (DFT-s-OFDM) symbols (also referred to as single carrier frequency-division multiple access (SC-FDMA) symbols) (for power limited scenarios; limited to a single stream transmission). The number of slots within a subframe is based on the CP and the numerology. The numerology defines the subcarrier spacing (SCS) and, effectively, the symbol length/duration, which is equal to 1/SCS.

| $\mu$ | SCS $\Delta f = 2^\mu \cdot 15$ [kHz] | Cyclic prefix |
|---|---|---|
| 0 | 15 | Normal |
| 1 | 30 | Normal |
| 2 | 60 | Normal, Extended |
| 3 | 120 | Normal |
| 4 | 240 | Normal |

For normal CP (14 symbols/slot), different numerologies $\mu$ 0 to 4 allow for 1, 2, 4, 8, and 16 slots, respectively, per subframe. For extended CP, the numerology 2 allows for 4 slots per subframe. Accordingly, for normal CP and numerology $\mu$, there are 14 symbols/slot and $2^\mu$ slots/subframe. The subcarrier spacing may be equal to $2^\mu * 15$ kHz, where $\mu$ is the numerology 0 to 4. As such, the numerology $\mu=0$ has a subcarrier spacing of 15 kHz and the numerology $\mu=4$ has a subcarrier spacing of 240 kHz. The symbol length/duration is inversely related to the subcarrier spacing. FIGS. 2A-2D provide an example of normal CP with 14 symbols per slot and numerology $\mu=2$ with 4 slots per subframe. The slot duration is 0.25 ms, the subcarrier spacing is 60 kHz, and the symbol duration is approximately 16.67 μs. Within a set of frames, there may be one or more different bandwidth parts (BWPs) (see FIG. 2B) that are frequency division multiplexed. Each BWP may have a particular numerology and CP (normal or extended).

A resource grid may be used to represent the frame structure. Each time slot includes a resource block (RB) (also referred to as physical RBs (PRBs)) that extends 12 consecutive subcarriers. The resource grid is divided into multiple resource elements (REs). The number of bits carried by each RE depends on the modulation scheme.

As illustrated in FIG. 2A, some of the REs carry reference (pilot) signals (RS) for the UE. The RS may include demodulation RS (DM-RS) (indicated as R for one particular configuration, but other DM-RS configurations are possible) and channel state information reference signals (CSI-RS) for channel estimation at the UE. The RS may also include beam measurement RS (BRS), beam refinement RS (BRRS), and phase tracking RS (PT-RS).

FIG. 2B illustrates an example of various DL channels within a subframe of a frame. The physical downlink control channel (PDCCH) carries DCI within one or more control channel elements (CCEs) (e.g., 1, 2, 4, 8, or 16 CCEs), each CCE including six RE groups (REGs), each REG including 12 consecutive REs in an OFDM symbol of an RB. A PDCCH within one BWP may be referred to as a control resource set (CORESET). A UE is configured to monitor PDCCH candidates in a PDCCH search space (e.g., common search space, UE-specific search space) during PDCCH monitoring occasions on the CORESET, where the PDCCH candidates have different DCI formats and different aggregation levels. Additional BWPs may be located at greater and/or lower frequencies across the channel bandwidth. A primary synchronization signal (PSS) may be within symbol 2 of particular subframes of a frame. The PSS is used by a UE 104 to determine subframe/symbol timing and a physical layer identity. A secondary synchronization signal (SSS) may be within symbol 4 of particular subframes of a frame. The SSS is used by a UE to determine a physical layer cell identity group number and radio frame timing. Based on the physical layer identity and the physical layer cell identity group number, the UE can determine a physical cell identifier (PCI). Based on the PCI, the UE can determine the locations of the DM-RS. The physical broadcast channel (PBCH), which carries a master information block (MIB), may be logically grouped with the PSS and SSS to form a synchronization signal (SS)/PBCH block (also referred to as SS block (SSB)). The MIB provides a number of RBs in the system bandwidth and a system frame number (SFN). The physical downlink shared channel (PDSCH) carries user data, broadcast system information not transmitted through the PBCH such as system information blocks (SIBs), and paging messages.

As illustrated in FIG. 2C, some of the REs carry DM-RS (indicated as R for one particular configuration, but other DM-RS configurations are possible) for channel estimation at the base station. The UE may transmit DM-RS for the physical uplink control channel (PUCCH) and DM-RS for the physical uplink shared channel (PUSCH). The PUSCH DM-RS may be transmitted in the first one or two symbols of the PUSCH. The PUCCH DM-RS may be transmitted in different configurations depending on whether short or long PUCCHs are transmitted and depending on the particular PUCCH format used. The UE may transmit sounding reference signals (SRS). The SRS may be transmitted in the last symbol of a subframe. The SRS may have a comb structure, and a UE may transmit SRS on one of the combs. The SRS may be used by a base station for channel quality estimation to enable frequency-dependent scheduling on the UL.

FIG. 2D illustrates an example of various UL channels within a subframe of a frame. The PUCCH may be located as indicated in one configuration. The PUCCH carries uplink control information (UCI), such as scheduling requests, a channel quality indicator (CQI), a precoding matrix indicator (PMI), a rank indicator (RI), and hybrid automatic repeat request (HARQ) acknowledgment (ACK) (HARQ-ACK) feedback (i.e., one or more HARQ ACK bits indicating one or more ACK and/or negative ACK (NACK)). The PUSCH carries data, and may additionally be used to carry a buffer status report (BSR), a power headroom report (PHR), and/or UCI.

Figure 3:
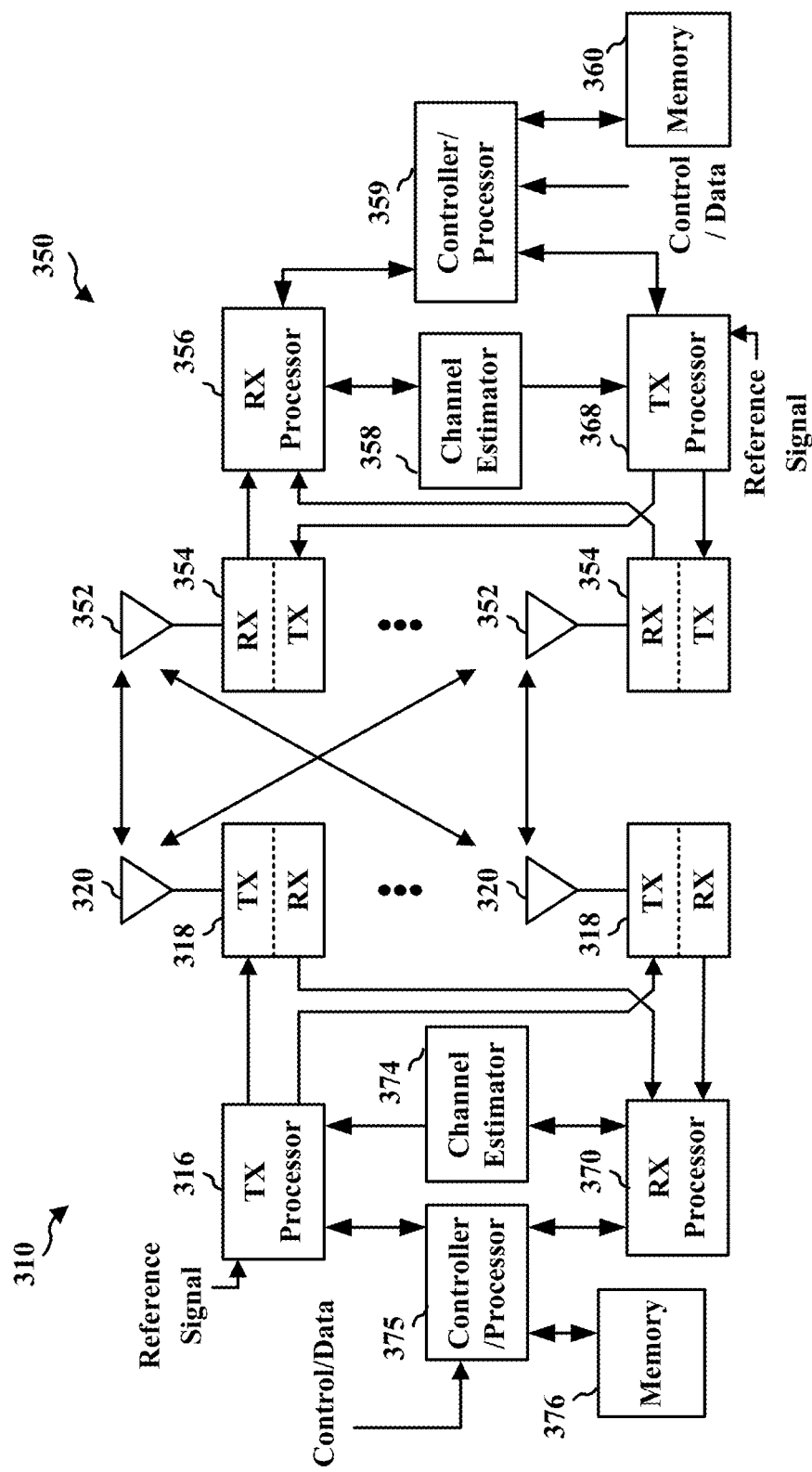
FIG. 3 is a diagram illustrating an example of a base station and user equipment (UE) in an access network.

FIG. 3 is a block diagram of a base station 310 in communication with a UE 350 in an access network. In the DL, IP packets from the EPC 160 may be provided to a controller/processor 375. The controller/processor 375 implements layer 3 and layer 2 functionality. Layer 3 includes a radio resource control (RRC) layer, and layer 2 includes a service data adaptation protocol (SDAP) layer, a packet data convergence protocol (PDCP) layer, a radio link control (RLC) layer, and a medium access control (MAC) layer. The controller/processor 375 provides RRC layer functionality associated with broadcasting of system information (e.g., MIB, SIBs), RRC connection control (e.g., RRC connection paging, RRC connection establishment, RRC connection modification, and RRC connection release), inter radio access technology (RAT) mobility, and measurement configuration for UE measurement reporting; PDCP layer functionality associated with header compression/decompression, security (ciphering, deciphering, integrity protection, integrity verification), and handover support functions; RLC layer functionality associated with the transfer of upper layer packet data units (PDUs), error correction through ARQ, concatenation, segmentation, and reassembly of RLC service data units (SDUs), re-segmentation of RLC data PDUs, and reordering of RLC data PDUs; and MAC layer functionality associated with mapping between logical channels and transport channels, multiplexing of MAC SDUs onto transport blocks (TBs), demultiplexing of MAC SDUs from TBs, scheduling information reporting, error correction through HARQ, priority handling, and logical channel prioritization.

The transmit (TX) processor 316 and the receive (RX) processor 370 implement layer 1 functionality associated with various signal processing functions. Layer 1, which includes a physical (PHY) layer, may include error detection on the transport channels, forward error correction (FEC) coding/decoding of the transport channels, interleaving, rate matching, mapping onto physical channels, modulation/demodulation of physical channels, and MIMO antenna processing. The TX processor 316 handles mapping to signal constellations based on various modulation schemes (e.g., binary phase-shift keying (BPSK), quadrature phase-shift keying (QPSK), M-phase-shift keying (M-PSK), M-quadrature amplitude modulation (M-QAM)). The coded and modulated symbols may then be split into parallel streams. Each stream may then be mapped to an OFDM subcarrier, multiplexed with a reference signal (e.g., pilot) in the time and/or frequency domain, and then combined together using an Inverse Fast Fourier Transform (IFFT) to produce a physical channel carrying a time domain OFDM symbol stream. The OFDM stream is spatially precoded to produce multiple spatial streams. Channel estimates from a channel estimator 374 may be used to determine the coding and modulation scheme, as well as for spatial processing. The channel estimate may be derived from a reference signal and/or channel condition feedback transmitted by the UE 350. Each spatial stream may then be provided to a different antenna 320 via a separate transmitter 318 TX. Each transmitter 318 TX may modulate a radio frequency (RF) carrier with a respective spatial stream for transmission.

At the UE 350, each receiver 354 RX receives a signal through its respective antenna 352. Each receiver 354 RX recovers information modulated onto an RF carrier and provides the information to the receive (RX) processor 356. The TX processor 368 and the RX processor 356 implement layer 1 functionality associated with various signal processing functions. The RX processor 356 may perform spatial processing on the information to recover any spatial streams destined for the UE 350. If multiple spatial streams are destined for the UE 350, they may be combined by the RX processor 356 into a single OFDM symbol stream. The RX processor 356 then converts the OFDM symbol stream from the time-domain to the frequency domain using a Fast Fourier Transform (FFT). The frequency domain signal comprises a separate OFDM symbol stream for each subcarrier of the OFDM signal. The symbols on each subcarrier, and the reference signal, are recovered and demodulated by determining the most likely signal constellation points transmitted by the base station 310. These soft decisions may be based on channel estimates computed by the channel estimator 358. The soft decisions are then decoded and deinterleaved to recover the data and control signals that were originally transmitted by the base station 310 on the physical channel. The data and control signals are then provided to the controller/processor 359, which implements layer 3 and layer 2 functionality.

The controller/processor 359 can be associated with a memory 360 that stores program codes and data. The memory 360 may be referred to as a computer-readable medium. In the UL, the controller/processor 359 provides demultiplexing between transport and logical channels, packet reassembly, deciphering, header decompression, and control signal processing to recover IP packets from the EPC 160. The controller/processor 359 is also responsible for error detection using an ACK and/or NACK protocol to support HARQ operations.

Similar to the functionality described in connection with the DL transmission by the base station 310, the controller/processor 359 provides RRC layer functionality associated with system information (e.g., MIB, SIBs) acquisition, RRC connections, and measurement reporting; PDCP layer functionality associated with header compression/decompression, and security (ciphering, deciphering, integrity protection, integrity verification); RLC layer functionality associated with the transfer of upper layer PDUs, error correction through ARQ, concatenation, segmentation, and reassembly of RLC SDUs, re-segmentation of RLC data PDUs, and reordering of RLC data PDUs; and MAC layer functionality associated with mapping between logical channels and transport channels, multiplexing of MAC SDUs onto TBs, demultiplexing of MAC SDUs from TBs, scheduling information reporting, error correction through HARQ, priority handling, and logical channel prioritization.

Channel estimates derived by a channel estimator 358 from a reference signal or feedback transmitted by the base station 310 may be used by the TX processor 368 to select the appropriate coding and modulation schemes, and to facilitate spatial processing. The spatial streams generated by the TX processor 368 may be provided to different antenna 352 via separate transmitters 354TX. Each transmitter 354TX may modulate an RF carrier with a respective spatial stream for transmission.

The UL transmission is processed at the base station 310 in a manner similar to that described in connection with the receiver function at the UE 350. Each receiver 318RX receives a signal through its respective antenna 320. Each receiver 318RX recovers information modulated onto an RF carrier and provides the information to a RX processor 370.

The controller/processor 375 can be associated with a memory 376 that stores program codes and data. The memory 376 may be referred to as a computer-readable medium. In the UL, the controller/processor 375 provides demultiplexing between transport and logical channels, packet reassembly, deciphering, header decompression, control signal processing to recover IP packets from the UE 350. IP packets from the controller/processor 375 may be provided to the EPC 160. The controller/processor 375 is also responsible for error detection using an ACK and/or NACK protocol to support HARQ operations.

At least one of the TX processor 368, the RX processor 356, and the controller/processor 359 may be configured to perform aspects in connection with 198 of FIG. 1.

At least one of the TX processor 316, the RX processor 370, and the controller/processor 375 may be configured to perform aspects in connection with 199 of FIG. 1.

Figure 4:
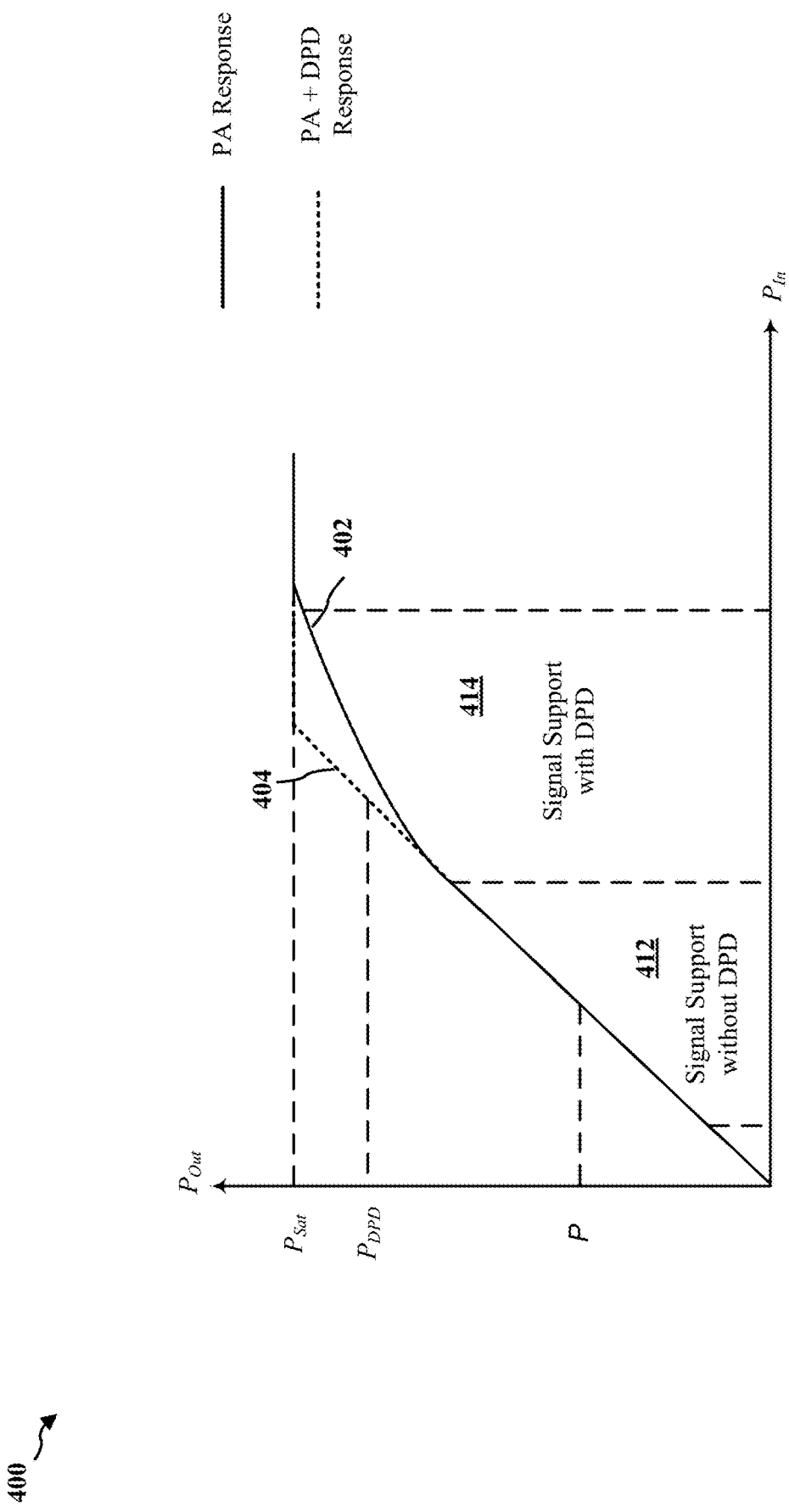
FIG. 4 is a diagram illustrating an example PA response.

FIG. 4 is a diagram 400 illustrating an example PA response. The PA response 402 is plotted showing the input power ($P_{in}$) to the PA on the horizontal axis and the output power ($P_{Out}$) of the PA on the vertical axis. In the first region 412, the output power of the PA may increase linearly with respect to the input power. Accordingly, the PA response 402 associated with the first region may resemble a straight line. As the input power continues to increase, if no PA non-linearity correction technique is utilized, in the second region 414, the PA response 402 may become nonlinear in that increases in the input power to the PA may result in a corresponding non-linear increase in the output power of the PA until the PA reaches saturation ($P_{Sat}$) where the output power may level out.

Digital pre-distortion (DPD) may be implemented at a transmitting wireless device (e.g., a UE) to correct for PA non-linearity. As illustrated in FIG. 4, PAs with a limited linear dynamic range (DR) may distort the transmitted signal due to a high peak-to-average-power-ratio (PAPR). The non-linear distortions may introduce in-band distortion, which may impact the link performance in terms of mutual information and/or error vector magnitudes (EVM). The non-linear distortions may also introduce out-of-band distortions, which may dictate the amount of adjacent channel interference (ACI). The ACI may generally correspond to how much the adjacent channel is "polluted" by the transmitted signal. To avoid such distortions, power back-off may be introduced, but power back-off may be associated with its own limitations. For example, a higher power back-off may have lower power efficiency for the transmitting device, less power being transmitted on the channel, and a smaller coverage. Accordingly, a poorer rate-over-range may also result, where the achievable communication rate at a specific path loss specification or distance from the transmitter may be reduced. A complementary method to power back-off is to use the DPD in the transmitter's digital front-end. Using the DPD, the amount of distortion may be maintained in some target level, while the power back-off may be reduced to be as low as possible, and hence the PA efficiency and/or rate-over-range may be improved. As shown in FIG. 4, with the DPD enabled, the combined PA and DPD response 404 may be linear in the second region 414 as well up to the point of saturation. However, DPD operations may typically be associated with signal sensing at the RF circuit. For example, based on the conventional DPD, the transmitted signal from all PAs may be received and measured for non-linearity estimation.

In some wireless communication systems there may be a very high quantity of transmit antenna arrays used by the transmitting stations (e.g., multiple spatial streams, transmission ports, beamforming configurations, antenna ports, etc.), with the cost of the feedback links being very high and, in some examples, impractical. In contrast to the conventional DPD, in over-the-air (OTA) DPD, the non-linear correction (e.g., pre-distortion) may occur in the transmitter based on reports from one or more assisting receivers (e.g., UEs). Accordingly, the expensive feedback links in the transmitting station may be avoided. The OTA DPD may generally be more efficient and more accurate than the conventional DPD.

The D2D communication (e.g., cellular vehicle-to-everything (CV2X) communication) may be gaining traction and importance. With the D2D communication, direct UE-to-UE communication (e.g., vehicle UE-to-vehicle UE communication) may be enabled without involvement of a base station. The D2D communication may be either between two UEs (i.e., a unicast mode) or between a group of UEs (i.e., a groupcast mode).

One or more aspects of the disclosure may relate to a framework for adopting OTA DPD for groupcast and unicast D2D communication modes. Specifically, the adaptation of the OTA DPD for the D2D/CV2X groupcast mode may be more challenging because multiple TX stations may be trained by multiple RX stations, while it may be desirable to minimize control signaling and other overhead. The unicast mode may be treated as a special case of the groupcast mode with a single TX station and a single RX station. The OTA DPD training process associated with the D2D groupcast mode may be performed in a number of stages.

Figure 5A:
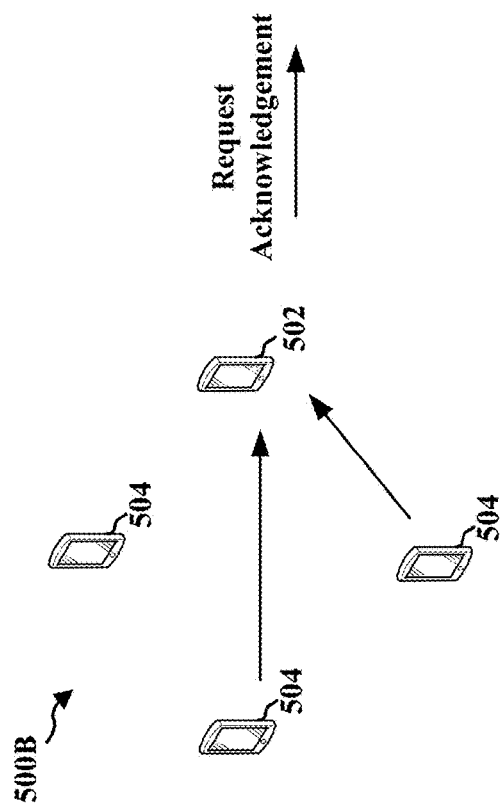
FIG. 5A is a diagram illustrating example capabilities exchange and training request stages in connection with the OTA DPD training process associated with the D2D groupcast mode.

FIG. 5A is a diagram 500A illustrating example capabilities exchange and training request stages in connection with the OTA DPD training process associated with the D2D groupcast mode. In the capabilities exchange stage, each UE 502 or 504 in the group may broadcast an indication of the capabilities of the UE 502 or 504 to the whole group. The capabilities may include DPD capabilities or DPD training capabilities. A UE 502 with DPD capabilities may be capable of performing DPD correction on the signals it transmits. According to the OTA DPD training process, a UE 502 with DPD capabilities may request assistance from other stations (e.g., other UEs) for training the DPD coefficients that may be applied by the UE 502 for PA non-linearity correction. Therefore, the UE 502 with DPD capabilities may be a requesting UE 502 in the OTA DPD training process. Hereinafter a requesting UE may also be referred to as a first UE.

A UE 504 with DPD training capabilities may be capable of providing assistance in the OTA DPD training process as a service to a requesting UE 502. Therefore, the UE 504 with DPD training capabilities may be an assisting UE 504 in the OTA DPD training process. Hereinafter an assisting UE may also be referred to as a second UE. In different configurations, a UE may possess DPD capabilities but not DPD training capabilities, may possess DPD training capabilities but not DPD capabilities, or may possess both DPD capabilities and DPD training capabilities. In different aspects, in the OTA DPD training process, a UE may act as one of a requesting UE or an assisting UE, or may act as both a requesting UE and an assisting UE.

The DPD training capabilities may be associated with certain attributes. Examples of the attributes may include a bandwidth restriction or a maximum number (quantity) of kernels associated with the OTA DPD training process. The attributes may be associated with the complexity limitation of each assisting UE 504.

The signaling of the capabilities of the UEs 502 and 504 may be part of the group establishment process, and may be performed via one or more higher layer messages. The OTA DPD training process associated with the D2D groupcast mode may start if the group includes at least one requesting UE 502 and at least one assisting UE 504 with the requesting UE 502 and the assisting UE 504 being different UEs if there is a single requesting UE 502 and a single assisting UE 504 in the group.

In the training request stage, each requesting UE 502 may broadcast a training request message to the other UEs in the group. The training request message may correspond to a request to train the DPD coefficients of the requesting UE 502. The training request message may include training parameters. Examples of the training parameters may include a list of kernels to use in the OTA DPD training process (the list of kernels may relate to known non-linearity associated with the requesting UE 502) or information about prioritization of frequency bands (e.g., the training may be associated with optimization of the overall performance, the out-of-band performance in relation to reduction of out-of-band distortions, or the in-band performance in relation to reduction of in-band distortions, etc.), and so on. The training request message may also include information about the DMRS to be transmitted in the dedicated slot in the pilot stage. The DMRS may be used by one or more assisting UEs 504 for estimating the DPD coefficients. Further, the training request message may include additional information about how the group may acknowledge the training request message. For example, the training request message may include an indication of the time-frequency resources that may be used for the transmission of the request acknowledgement messages.

Moreover, the training request message may be broadcasted multiple times. In one configuration, the requesting UE 502 may periodically broadcast a new training request message to provide the latest information about the DPD coefficients at the requesting UE 502. In another configuration, the requesting UE 502 may broadcast a new training request message when there is a change in the modulation at the requesting UE 502. A modulation change may be associated with a change in the output power and therefore a change in non-linearity. Accordingly, the requesting UE 502 may broadcast a new training request message to initiate a process to retrain the DPD coefficients in response to the modulation change.

Figure 5B:
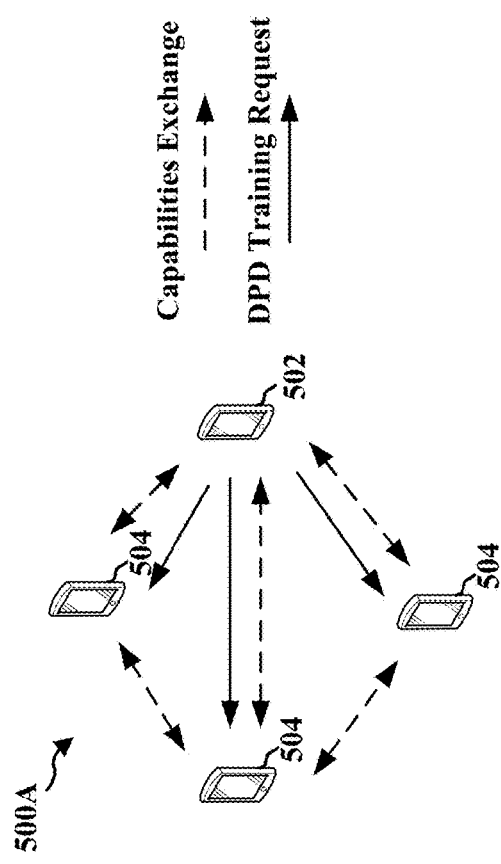
FIG. 5B is a diagram illustrating an example request acknowledgement stage in connection with the OTA DPD training process associated with the D2D groupcast mode.

FIG. 5B is a diagram 500B illustrating an example request acknowledgement stage in connection with the OTA DPD training process associated with the D2D groupcast mode. Each assisting UE 504 that has received the training request message and elects to participate in the OTA DPD training process may broadcast a request acknowledgement message for every training request message received. The request acknowledgement message may be a single predefined message that is allocated the same predefined time-frequency resources for all assisting UEs 504. Accordingly, subsequent to transmitting the training request message, a requesting UE 502 may then monitor the predefined time-frequency resources to identify whether any assisting UE 504 has responded to the training request message with a request acknowledgement message. If multiple assisting UEs 504 have acknowledged the training request message with the same predefined request acknowledgement messages using the same predefined time-frequency resources, the requesting UE 502 may observe the request acknowledgement messages based on macrodiversity. If there is no assisting UE 504 that has acknowledged the training request message, the requesting UE 502 may observe no energy at the predefined time-frequency resources, and may accordingly learn that there is no available assisting UE 504 for the OTA DPD training process.

In another configuration, each request acknowledgement message may be specific to the assisting UE 504 transmitting the request acknowledgement message, and may be associated with a separate set of time-frequency resources. Such a request acknowledgement message may include parameters such as a bandwidth limitation or a number (quantity) of kernels, and so on. The assisting UE 504 specific request acknowledgement message may be associated with a higher level of resources usage, but may include more than a yes or no answer. For example, an assisting UE 504 specific request acknowledgement message may include an indication of training capabilities of the assisting UE 504 or an indication of a signal quality (e.g., a signal-to-noise ratio (SNR) or a reference signal received power (RSRP), etc.) associated with the training request message received from the requesting UE 502.

In yet another configuration, multiple training categories may be defined. Example training categories may include full bandwidth training, half bandwidth training, etc. Each training category may be associated with a respective set of time-frequency resources for the transmission of the request acknowledgement messages associated with the training category. Based on the associated training category, an assisting UE 504 may select the appropriate set of time-frequency resources to transmit the request acknowledgement message. Therefore, the request acknowledgement messages from the assisting UEs 504 that are associated with a same training category may be transmitted via a same set of time-frequency resources.

In one configuration, an assisting UE 504 may transmit a request acknowledgement message when a signal quality (e.g., an SNR or an RSRP) associated with the training request message received from the requesting UE 502 is greater than a threshold. In other words, the assisting UE 504 may not transmit a request acknowledgement message when the signal quality (e.g., an SNR or an RSRP) associated with the training request message received from the requesting UE 502 is less than the threshold. Therefore, an assisting UE 504 may not participate in the training process when the signal quality associated with the signals received from the requesting UE 502 is not sufficiently high.

Figure 5C:
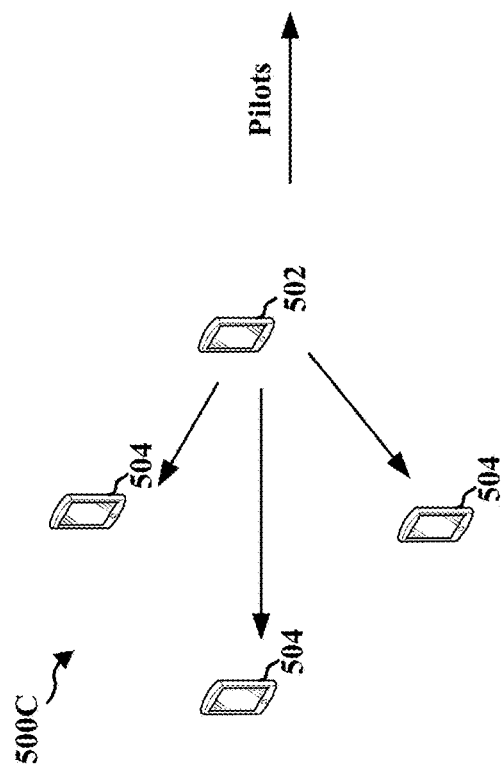
FIG. 5C is a diagram illustrating an example pilot stage in connection with the OTA DPD training process associated with the D2D groupcast mode.

FIG. 5C is a diagram 500C illustrating an example pilot stage in connection with the OTA DPD training process associated with the D2D groupcast mode. After receiving at least one request acknowledgement message, a requesting UE 502 may transmit, to one or more assisting UEs 504, one or more pilots for training the DPD coefficients. In one configuration, the pilots may be associated with the non-linearity (NL) RS (NLRS) structure. The NLRS may be a known type of pilots dedicated to non-linearity DPD estimation. Using the NLRS, the PA NL component may be decoupled from the multipath channel component.

In another configuration, the pilots may correspond to one or more DMRSs. The DMRSs may experience the PA non-linearity at the requesting UE 502. An assisting UE 504 may perform channel estimation and non-linearity estimation based on an iterative process. In particular, in the iterative process, an assisting UE 504 may refine iteratively the non-linearity estimate and the channel estimation. The iterative process may typically converge since a better channel estimation may lead to a better non-linearity estimate, which, in turn, may lead to a better still channel estimation, and so on. Based on the DMRSs, the assisting UE 504 may alternately refine the channel estimation and the non-linearity estimate.

Pilots typically may not be part of a normal transmission because transmitting the pilots as part of a normal transmission may violate EVM or adjacent channel leakage power ratio (ACLR) specifications with un-trained DPD. Therefore, the requesting UE 502 may transmit the pilots in a dedicated special slot. To reduce resource usage, mini slots (e.g., portions of a slot) may be defined. Each mini slot may include non-linearly compressed pilots from one of the requesting UEs 502. Therefore, multiple requesting UEs 502 may transmit the pilots via corresponding mini slots in the same slot for training their DPD coefficients. In other words, multiple requesting UEs 502 may share a single slot when transmitting the pilots. Accordingly, resource usage associated with transmitting the pilots may be reduced.

Figure 5D:
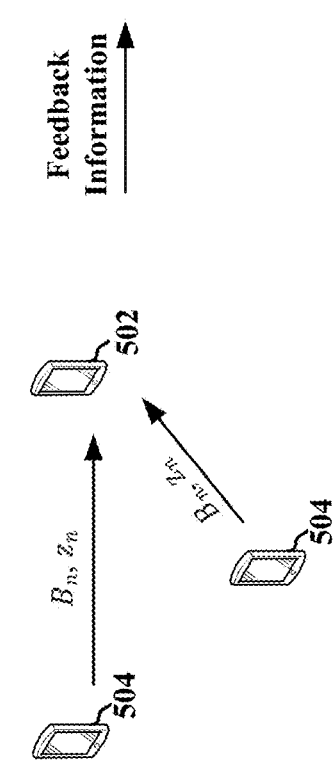
FIG. 5D is a diagram illustrating an example DPD parameter response stage in connection with the OTA DPD training process associated with the D2D groupcast mode.

FIG. 5D is a diagram 500D illustrating an example DPD parameter response stage in connection with the OTA DPD training process associated with the D2D groupcast mode. Each assisting UE 504 may identify or calculate a result based on the pilots received from the requesting UE 502, and may transmit the result to the requesting UE 502 via a feedback message. The requesting UE 502 may aggregate the results from one or more assisting UEs 504, and may identify or calculate the final DPD coefficients based on the aggregated results. The final DPD coefficients may be applied by the requesting UE 502 in the DPD process to correct for the PA non-linearity in the amplified signals. In one configuration, each assisting UE 504 may calculate and send to the requesting UE 502 the full non-linearity coefficient set. To calculate the final DPD coefficients, the requesting UE 502 may average the non-linearity models associated with the non-linearity coefficient sets received from the multiple assisting UEs 504. Averaging the non-linearity models may result in the canceling out of the errors in the individual non-linearity models. In other words, a processing gain associated with the OTA DPD training process may be obtained through the aggregation of the results from multiple assisting UEs 504.

In another configuration, each assisting UE 504 may calculate and send to the requesting UE 502 a subset of the data associated with the full non-linearity model. For example, each assisting UE 504 may be assigned a corresponding band in the full bandwidth, and may calculate and provide the subset of the data associated with the corresponding band. This may be useful when each assisting UE 504 is associated with a limited computation capacity, or when a limited bandwidth is allocated to each assisting UE 504.

The overall weighted least squares (WLS) model the requesting UE 502 may solve based on the subsets of the data received from the assisting UEs 504 may be given by:

$$\operatorname*{argmin}_{g} \|w(Ag - y)\|^2$$

where g may be the non-linearity coefficients vector that may be calculated (these may be the PA NL coefficients or the DPD coefficients directly), A may be a matrix whose columns may represent the non-linear kernels and each row may represent one equation (e.g., each row may represent a time domain sample or a frequency domain bin), y may be a target vector with each element representing the right hand side (RHS) target per equation (e.g., either a time domain sample or a frequency domain bin target), and W may be a weight diagonal matrix. The weight diagonal matrix may be configured for optimizing performance of different frequency regions. For example, either minimization of in-band distortions (e.g., such that the EVM may be minimized) or minimization of out-of-band distortions (e.g., such that the ACLR may be minimized) may be optimized. The weight diagonal matrix may also represent weights associated with respective assisting UEs 504 when the set of equations is aggregated from multiple assisting UEs 504 and the assisting UEs 504 may experience different signal qualities (e.g., SNRs) associated with the pilots. For example, the weight associated with an assisting UE 504 that has experienced a higher signal quality may be increased because the measurement made by this assisting UE 504 may be more reliable, and the weight associated with an assisting UE 504 that has experienced a lower signal quality may be decreased because the measurement made by this assisting UE 504 may be less reliable.

For the case of federated learning, where each assisting UE 504 may be assigned to work on a subset of the equations associated with a subset of w, A and y, the combined set of equations may be given by:

$$\operatorname*{argmin}_{g} \|w(Ag - y)\|^2 = \operatorname*{argmin}_{g} \left\| \begin{bmatrix} w_0 & & \\ & \ddots & \\ & & w_{N-1} \end{bmatrix} \left( \begin{bmatrix} A_0 \\ \vdots \\ A_{N-1} \end{bmatrix} g - \begin{bmatrix} y_0 \\ \vdots \\ y_{N-1} \end{bmatrix} \right) \right\|^2$$

where the n-th assisting UE 504 may build its corresponding subset of equations based on $A_n$, $y_n$, and $w_n$. Accordingly, the solution to the aggregated set of equations may be $g = (\Sigma_n A_n^H w_n A_n)^{-1} (\Sigma_n A_n^H w_n y_n)$, which may be calculated as follows: Each assisting UE 504 may signal to the requesting UE 502: $B_n = A_n^H w_n^H w_n A_n$ and $z_n = A_n^H w_n^H w_n y_n$. Thereafter, the requesting UE 502 may calculate $g = (\Sigma_n v_n B_n)^{-1} (\Sigma_n v_n z_n)$, where $v_n$ may be a scalar associated with the respective assisting UE 504 that may represent a quality metric the requesting UE 502 may choose to apply to each assisting UE 504 to normalize the size of the corresponding subset of data associated with the respective assisting UE 504. In another configuration, $v_n$ may be a scalar associated with the respective assisting UE 504 that may represent a corresponding SNR the respective assisting UE 504 has experienced when receiving the pilots. Therefore, the signaling overhead may be minimal because the number of DPD kernels may be small, and $B_n$ and $z_n$ may typically be small as well. An optimal WLS solution may be achieved based on the techniques described heretofore.

Figure 6:
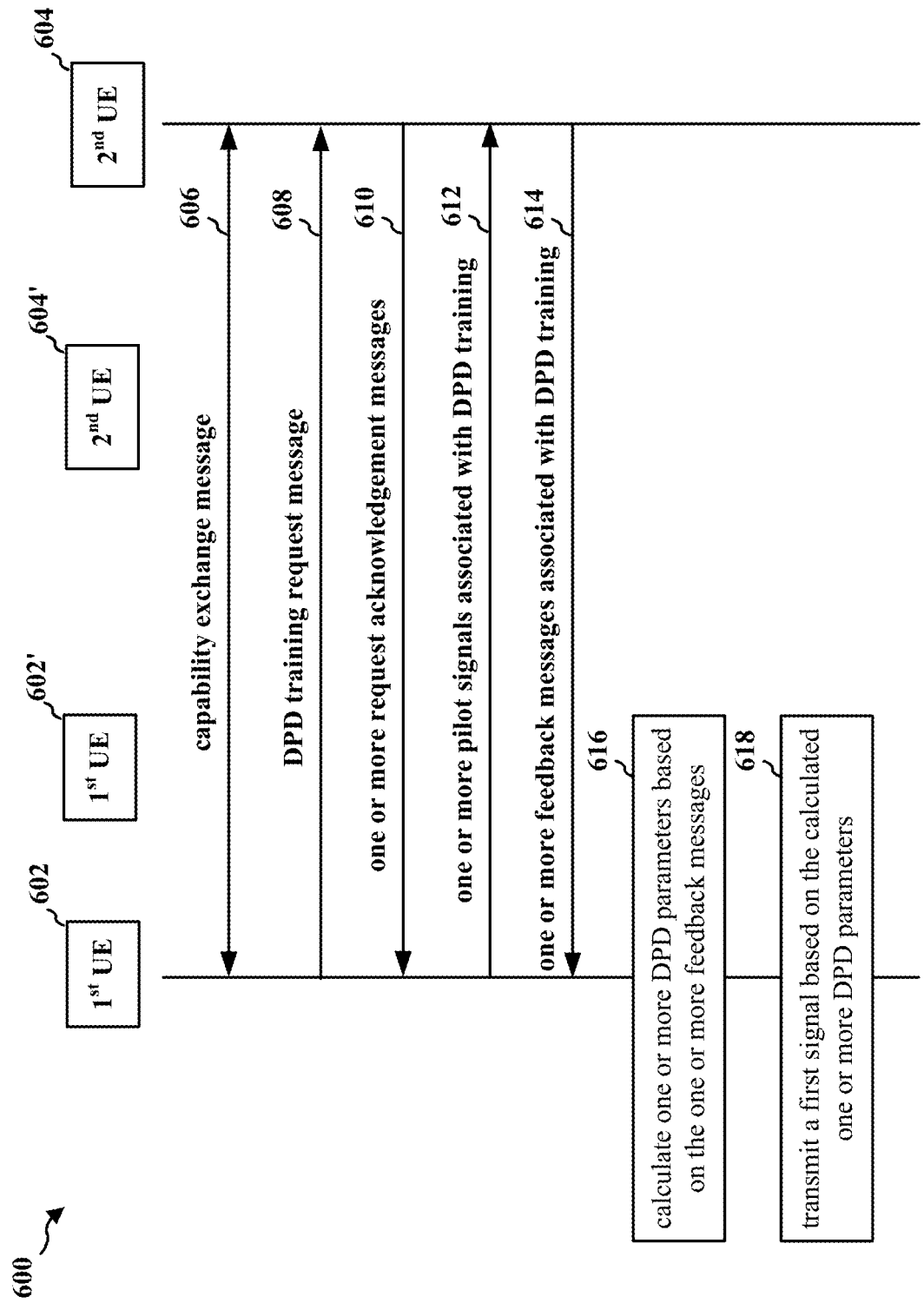
FIG. 6 is a diagram of a communication flow of a method of wireless communication.

FIG. 6 is a diagram of a communication flow 600 of a method of wireless communication. At 606, the first UE 602 or the second UE 604 may transmit, to at least one other UE via a first broadcast message, a capability exchange message. For the first UE 602, the capability exchange message may include at least a DPD capability indication. For the second UE 604, the capability exchange message may include at least a DPD training capability indication. The DPD training capability indication may include at least one of bandwidth restriction information or an indication of a number (quantity) of kernels.

At 608, the first UE 602 may transmit, to the one or more second UEs 604 via a second broadcast message, a DPD training request message.

In one configuration, the DPD training request message 608 may include at least one of one or more DPD training parameters, DMRS information, or request acknowledgement message information. The one or more DPD training parameters may include at least one of a list of kernels or prioritization information associated with one or more frequency bands.

In one configuration, the DPD training request message 608 may be transmitted a plurality of times.

At 610, the first UE 602 may receive, from a first subset of the one or more second UEs 604, one or more request acknowledgement messages. Each second UE 604 in the first subset of the one or more second UEs 604 may correspond to one of the one or more request acknowledgement messages 610.

In one configuration, the one or more request acknowledgement messages 610 may be transmitted and received via a same predetermined set of time-frequency resources.

In one configuration, each of the one or more request acknowledgement messages 610 may be transmitted and received via a respective set of time-frequency resources associated with the corresponding second UE 604.

In one configuration, at least one of the one or more request acknowledgement messages 610 may include at least one of training capability information associated with the corresponding second UE 604 or a signal quality indication associated with a signal from the first UE 602 to the corresponding second UE 604.

In one configuration, the one or more request acknowledgement messages 610 may be transmitted and received via a plurality of sets of time-frequency resources. Each set of the plurality of sets of time-frequency resources may be associated with one of a plurality of training categories.

At 612, the first UE 602 may transmit, to a second subset of one or more second UEs 604, one or more pilot signals associated with DPD training.

In one configuration, the one or more pilot signals 612 may correspond to one or more NLRSs or one or more DMRSs.

In one configuration, the one or more pilot signals 612 may be associated with a slot. The slot may be associated with at least one other pilot signal from at least one other first UE 602'.

At 614, the first UE 602 may receive, from a third subset of the one or more second UEs 604, one or more feedback messages associated with DPD training. The one or more feedback messages 614 may be based on the one or more pilot signals 612. Each second UE 604 in the third subset of the one or more second UEs 604 may correspond to one of the one or more feedback messages 614.

In one configuration, the one or more feedback messages 614 may correspond to a cross-correlation or an autocorrelation of a list of kernels.

In one configuration, the first subset of the one or more second UEs 604 and the second subset of the one or more second UEs 604 may be the same. In another configuration, the second subset of the one or more second UEs 604 may be a subset of the first subset of the one or more second UEs 604.

In one configuration, the second subset of the one or more second UEs 604 and the third subset of the one or more second UEs 604 may be the same. In another configuration, the third subset of the one or more second UEs 604 may be a subset of the second subset of the one or more second UEs 604.

At 616, the first UE 602 may calculate one or more DPD parameters based on the one or more feedback messages 614.

At 618, the first UE 602 may transmit a first signal based on the calculated one or more DPD parameters.

Figure 7:
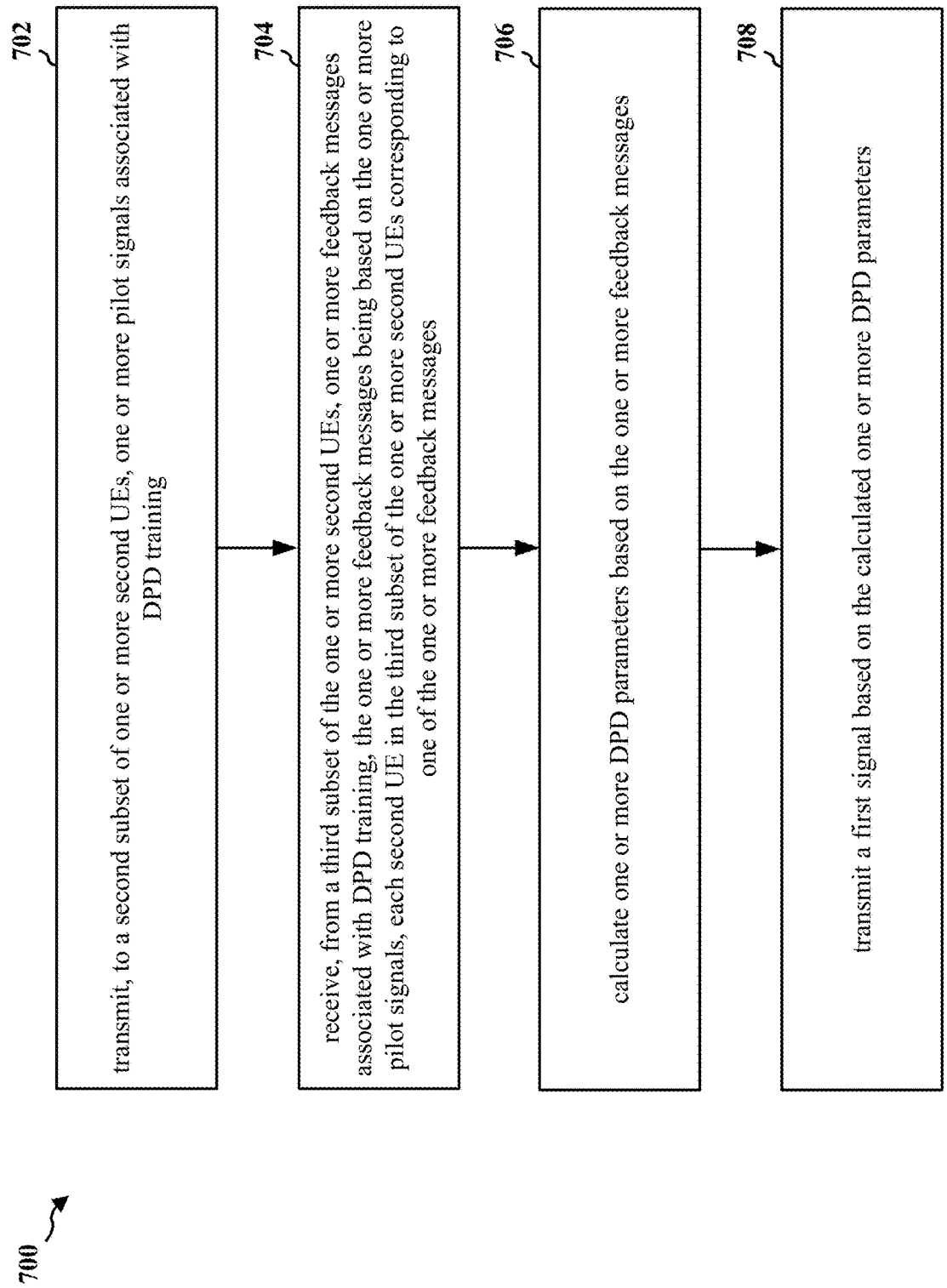
FIG. 7 is a flowchart of a method of wireless communication.

FIG. 7 is a flowchart 700 of a method of wireless communication. The method may be performed by a first UE (e.g., the UE 104/350; a first UE 602; the apparatus 1102). At 702, the first UE may transmit, to a second subset of one or more second UEs, one or more pilot signals associated with DPD training. For example, 702 may be performed by the DPD training component 1140 in FIG. 11. Referring to FIG. 6, at 612, the first UE 602 may transmit, to a second subset of one or more second UEs 604, one or more pilot signals associated with DPD training.

At 704, the first UE may receive, from a third subset of the one or more second UEs, one or more feedback messages associated with DPD training. The one or more feedback messages may be based on the one or more pilot signals. Each second UE in the third subset of the one or more second UEs may correspond to one of the one or more feedback messages. For example, 704 may be performed by the DPD training component 1140 in FIG. 11. Referring to FIG. 6, at 614, the first UE 602 may receive, from a third subset of the one or more second UEs 604, one or more feedback messages associated with DPD training.

At 706, the first UE may calculate one or more DPD parameters based on the one or more feedback messages. For example, 706 may be performed by the DPD training component 1140 in FIG. 11. Referring to FIG. 6, at 616, the first UE 602 may calculate one or more DPD parameters based on the one or more feedback messages 614.

At 708, the first UE may transmit a first signal based on the calculated one or more DPD parameters. For example, 708 may be performed by the DPD training component 1140 in FIG. 11. Referring to FIG. 6, at 618, the first UE 602 may transmit a first signal based on the calculated one or more DPD parameters.

Figure 8:
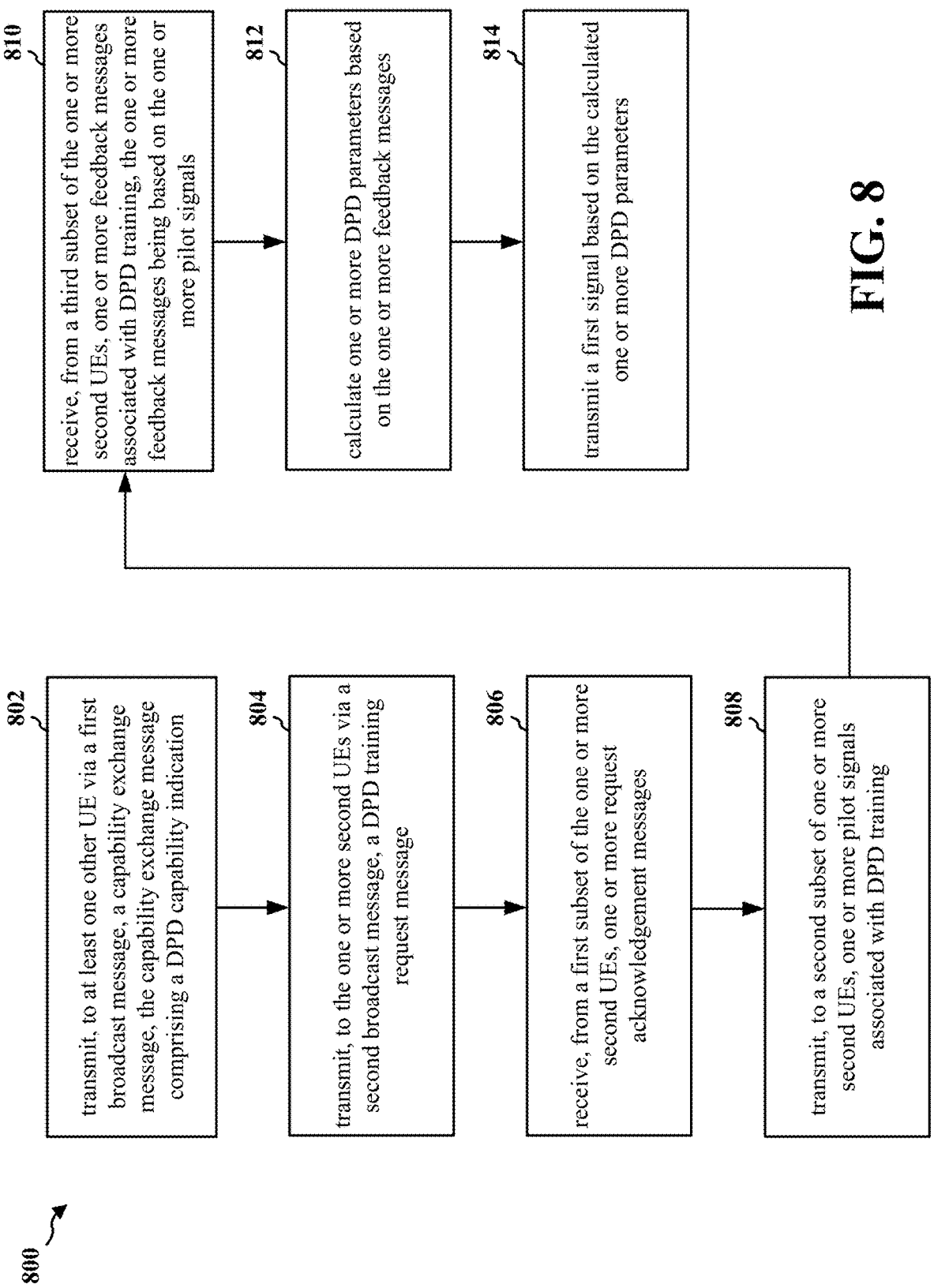
FIG. 8 is a flowchart of a method of wireless communication.

FIG. 8 is a flowchart 800 of a method of wireless communication. The method may be performed by a first UE (e.g., the UE 104/350; a first UE 602; the apparatus 1102). At 808, the first UE may transmit, to a second subset of one or more second UEs, one or more pilot signals associated with DPD training. For example, 808 may be performed by the DPD training component 1140 in FIG. 11. Referring to FIG. 6, at 612, the first UE 602 transmit, to a second subset of one or more second UEs 604, one or more pilot signals associated with DPD training.

At 810, the first UE may receive, from a third subset of the one or more second UEs, one or more feedback messages associated with DPD training. The one or more feedback messages may be based on the one or more pilot signals. Each second UE in the third subset of the one or more second UEs may correspond to one of the one or more feedback messages. For example, 810 may be performed by the DPD training component 1140 in FIG. 11. Referring to FIG. 6, at 614, the first UE 602 may receive, from a third subset of the one or more second UEs 604, one or more feedback messages associated with DPD training.

At 812, the first UE may calculate one or more DPD parameters based on the one or more feedback messages. For example, 812 may be performed by the DPD training component 1140 in FIG. 11. Referring to FIG. 6, at 616, the first UE 602 may calculate one or more DPD parameters based on the one or more feedback messages 614.

At 814, the first UE may transmit a first signal based on the calculated one or more DPD parameters. For example, 814 may be performed by the DPD training component 1140 in FIG. 11. Referring to FIG. 6, at 618, the first UE 602 may transmit a first signal based on the calculated one or more DPD parameters.

In one configuration, at 802, the first UE may transmit, to at least one other UE via a first broadcast message, a capability exchange message. The capability exchange message may include a DPD capability indication. For example, 802 may be performed by the DPD training component 1140 in FIG. 11. Referring to FIG. 6, at 606, the first UE 602 may transmit, to at least one other UE via a first broadcast message, a capability exchange message.

In one configuration, referring to FIG. 6, the capability exchange message 606 may further include a DPD training capability indication. The DPD training capability indication may include at least one of bandwidth restriction information or an indication of a number of kernels.

In one configuration, at 804, the first UE may transmit, to the one or more second UEs via a second broadcast message, a DPD training request message. For example, 804 may be performed by the DPD training component 1140 in FIG. 11. Referring to FIG. 6, at 608, the first UE 602 may transmit, to the one or more second UEs 604 via a second broadcast message, a DPD training request message.

At 806, the first UE may receive, from a first subset of the one or more second UEs, one or more request acknowledgement messages. Each second UE in the first subset of the one or more second UEs may correspond to one of the one or more request acknowledgement messages. For example, 806 may be performed by the DPD training component 1140 in FIG. 11. Referring to FIG. 6, at 610, the first UE 602 may receive, from a first subset of the one or more second UEs 604, one or more request acknowledgement messages.

In one configuration, referring to FIG. 6, the DPD training request message 608 may include at least one of one or more DPD training parameters, DMRS information, or request acknowledgement message information. The one or more DPD training parameters may include at least one of a list of kernels or prioritization information associated with one or more frequency bands.

In one configuration, referring to FIG. 6, the DPD training request message 608 may be transmitted a plurality of times.

In one configuration, referring to FIG. 6, the one or more request acknowledgement messages 610 may be received via a same set of time-frequency resources.

In one configuration, referring to FIG. 6, each of the one or more request acknowledgement messages 610 may be received via a respective set of time-frequency resources associated with the corresponding second UE.

In one configuration, referring to FIG. 6, at least one of the one or more request acknowledgement messages 610 may include at least one of training capability information associated with the corresponding second UE 604 or a signal quality indication associated with a signal from the first UE 602 to the corresponding second UE 604.

In one configuration, referring to FIG. 6, the one or more request acknowledgement messages 610 may be received via a plurality of sets of time-frequency resources. Each set of the plurality of sets of time-frequency resources may be associated with one of a plurality of training categories.

In one configuration, referring to FIG. 6, the one or more pilot signals 612 may correspond to one or more NLRSs or one or more DMRSs.

In one configuration, referring to FIG. 6, the one or more pilot signals 612 may be associated with a slot. The slot may be associated with at least one other pilot signal from at least one other first UE 602'.

In one configuration, referring to FIG. 6, the one or more feedback messages 614 may correspond to a cross-correlation or an autocorrelation of a list of kernels.

Figure 9:
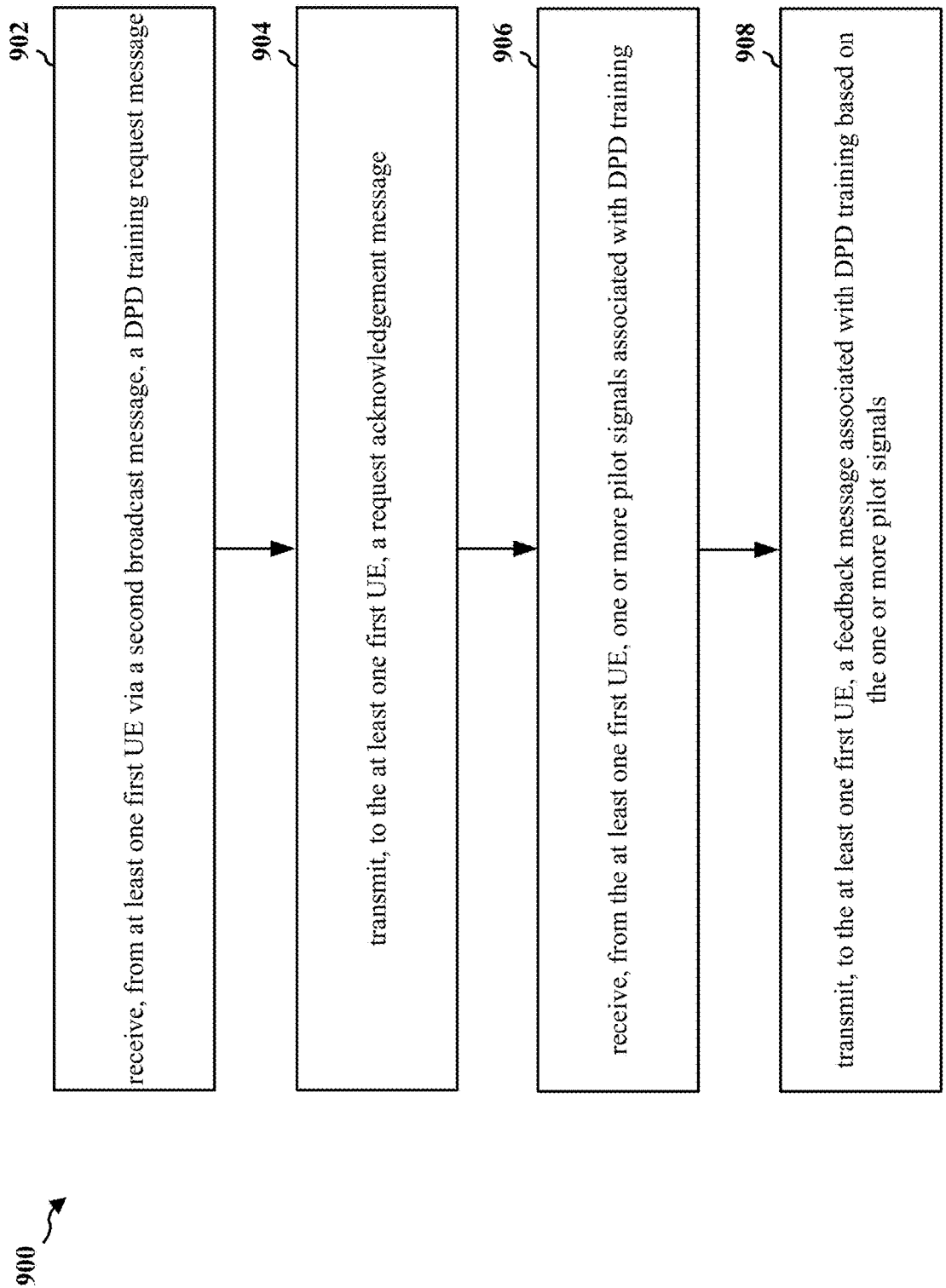
FIG. 9 is a flowchart of a method of wireless communication.

FIG. 9 is a flowchart 900 of a method of wireless communication. The method may be performed by a second UE (e.g., the UE 104'/350; a second UE 604; the apparatus 1202). At 902, the second UE may receive, from at least one first UE via a second broadcast message, a DPD training request message. For example, 902 may be performed by the DPD training component 1240 in FIG. 12. Referring to FIG. 6, at 608, the second UE 604 may receive, from at least one first UE 602 via a second broadcast message, a DPD training request message.

At 904, the second UE may transmit, to the at least one first UE, a request acknowledgement message. For example, 904 may be performed by the DPD training component 1240 in FIG. 12. Referring to FIG. 6, at 610, the second UE 604 may transmit, to the at least one first UE 602, a request acknowledgement message.

At 906, the second UE may receive, from the at least one first UE, one or more pilot signals associated with DPD training. For example, 906 may be performed by the DPD training component 1240 in FIG. 12. Referring to FIG. 6, at 612, the second UE 604 may receive, from the at least one first UE 602, one or more pilot signals associated with DPD training.

At 908, the second UE may transmit, to the at least one first UE, a feedback message associated with DPD training based on the one or more pilot signals. For example, 908 may be performed by the DPD training component 1240 in FIG. 12. Referring to FIG. 6, at 614, the second UE 604 may transmit, to the at least one first UE 602, a feedback message associated with DPD training based on the one or more pilot signals.

Figure 10:
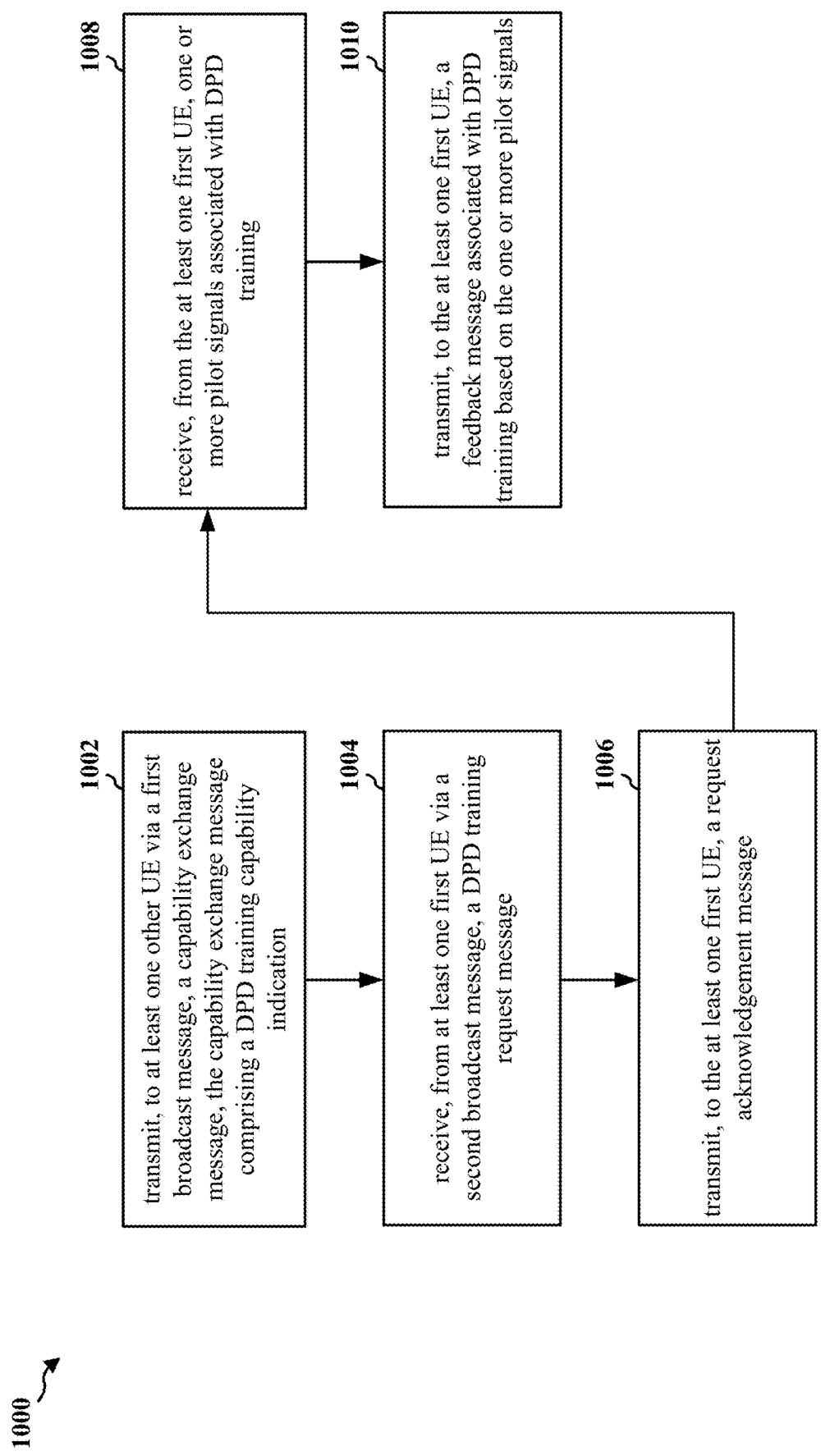
FIG. 10 is a flowchart of a method of wireless communication.

FIG. 10 is a flowchart 1000 of a method of wireless communication. The method may be performed by a second UE (e.g., the UE 104'/350; a second UE 604; the apparatus 1202). At 1004, the second UE may receive, from at least one first UE via a second broadcast message, a DPD training request message. For example, 1004 may be performed by the DPD training component 1240 in FIG. 12. Referring to FIG. 6, at 608, the second UE 604 may receive, from at least one first UE 602 via a second broadcast message, a DPD training request message.

At 1006, the second UE may transmit, to the at least one first UE, a request acknowledgement message. For example, 1006 may be performed by the DPD training component 1240 in FIG. 12. Referring to FIG. 6, at 610, the second UE 604 may transmit, to the at least one first UE 602, a request acknowledgement message.

At 1008, the second UE may receive, from the at least one first UE, one or more pilot signals associated with DPD training. For example, 1008 may be performed by the DPD training component 1240 in FIG. 12. Referring to FIG. 6, at 612, the second UE 604 may receive, from the at least one first UE 602, one or more pilot signals associated with DPD training.

At 1010, the second UE may transmit, to the at least one first UE, a feedback message associated with DPD training based on the one or more pilot signals. For example, 1010 may be performed by the DPD training component 1240 in FIG. 12. Referring to FIG. 6, at 614, the second UE 604 may transmit, to the at least one first UE 602, a feedback message associated with DPD training based on the one or more pilot signals.

In one configuration, at 1002, the second UE may transmit, to at least one other UE via a first broadcast message, a capability exchange message. The capability exchange message may include a DPD training capability indication. The DPD training capability indication may include at least one of bandwidth restriction information or an indication of a number of kernels. For example, 1002 may be performed by the DPD training component 1240 in FIG. 12. Referring to FIG. 6, at 606, the second UE 604 may transmit, to at least one other UE via a first broadcast message, a capability exchange message.

In one configuration, referring to FIG. 6, the capability exchange message 606 may further include a DPD capability indication.

In one configuration, referring to FIG. 6, the DPD training request message 608 may include at least one of one or more DPD training parameters, DMRS information, or request acknowledgement message information. The one or more DPD training parameters may include at least one of a list of kernels or prioritization information associated with one or more frequency bands.

In one configuration, referring to FIG. 6, the DPD training request message 608 may be received a plurality of times.

In one configuration, referring to FIG. 6, the request acknowledgement message 610 may be transmitted via a set of time-frequency resources. The set of time-frequency resources may be associated with at least one other request acknowledgement message from at least one other second UE 604'.

In one configuration, the set of time-frequency resources may be associated with one of a plurality of training categories.

In one configuration, referring to FIG. 6, the request acknowledgement message 610 may be transmitted via a set of time-frequency resources associated with the second UE 604.

In one configuration, referring to FIG. 6, the request acknowledgement message 610 may include at least one of training capability information associated with the second UE 604 or a signal quality indication associated with a signal from the at least one first UE 602 to the second UE 604.

In one configuration, referring to FIG. 6, the one or more pilot signals 612 may correspond to one or more NLRSs or one or more DMRSs.

In one configuration, referring to FIG. 6, the one or more pilot signals 612 may be associated with a slot. The slot may be associated with at least one other pilot signal from at least one other first UE 602'.

In one configuration, referring to FIG. 6, the feedback message 614 may correspond to a cross-correlation or an autocorrelation of a list of kernels.

Figure 11:
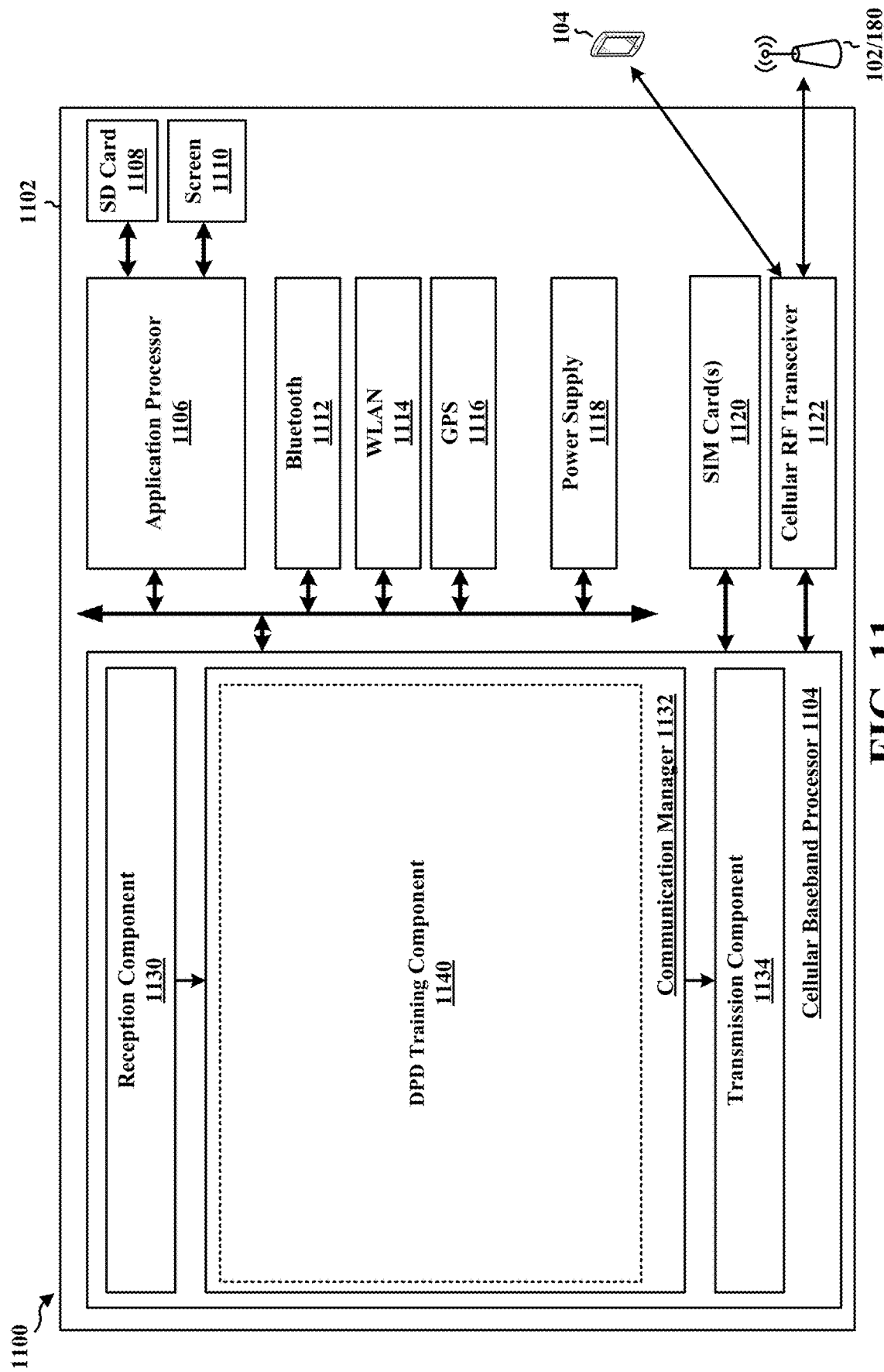
FIG. 11 is a diagram illustrating an example of a hardware implementation for an example apparatus.

FIG. 11 is a diagram 1100 illustrating an example of a hardware implementation for an apparatus 1102. The apparatus 1102 may be a first UE, a component of a first UE, or may implement first UE functionality. In some aspects, the apparatus 1102 may include a cellular baseband processor 1104 (also referred to as a modem) coupled to a cellular RF transceiver 1122. In some aspects, the apparatus 1102 may further include one or more subscriber identity modules (SIM) cards 1120, an application processor 1106 coupled to a secure digital (SD) card 1108 and a screen 1110, a Bluetooth module 1112, a wireless local area network (WLAN) module 1114, a Global Positioning System (GPS) module 1116, or a power supply 1118. The cellular baseband processor 1104 communicates through the cellular RF transceiver 1122 with the UE 104 and/or BS 102/180. The cellular baseband processor 1104 may include a computer-readable medium/memory. The computer-readable medium/memory may be non-transitory. The cellular baseband processor 1104 is responsible for general processing, including the execution of software stored on the computer-readable medium/memory. The software, when executed by the cellular baseband processor 1104, causes the cellular baseband processor 1104 to perform the various functions described supra. The computer-readable medium/memory may also be used for storing data that is manipulated by the cellular baseband processor 1104 when executing software. The cellular baseband processor 1104 further includes a reception component 1130, a communication manager 1132, and a transmission component 1134. The communication manager 1132 includes the one or more illustrated components. The components within the communication manager 1132 may be stored in the computer-readable medium/memory and/or configured as hardware within the cellular baseband processor 1104. The cellular baseband processor 1104 may be a component of the UE 350 and may include the memory 360 and/or at least one of the TX processor 368, the RX processor 356, and the controller/processor 359. In one configuration, the apparatus 1102 may be a modem chip and include just the baseband processor 1104, and in another configuration, the apparatus 1102 may be the entire UE (e.g., see 350 of FIG. 3) and include the additional modules of the apparatus 1102.

The communication manager 1132 includes a DPD training component 1140 that may be configured to transmit, to at least one other UE via a first broadcast message, a capability exchange message, e.g., as described in connection with 802 in FIG. 8. The DPD training component 1140 may be configured to transmit, to the one or more second UEs via a second broadcast message, a DPD training request message, e.g., as described in connection with 804 in FIG. 8. The DPD training component 1140 may be configured to receive, from a first subset of the one or more second UEs, one or more request acknowledgement messages, e.g., as described in connection with 806 in FIG. 8. The DPD training component 1140 may be configured to transmit, to a second subset of one or more second UEs, one or more pilot signals associated with DPD training, e.g., as described in connection with 702 in FIG. 7 and 808 in FIG. 8. The DPD training component 1140 may be configured to receive, from a third subset of the one or more second UEs, one or more feedback messages associated with DPD training, e.g., as described in connection with 704 in FIG. 7 and 810 in FIG. 8. The DPD training component 1140 may be configured to calculate one or more DPD parameters based on the one or more feedback messages, e.g., as described in connection with 706 in FIG. 7 and 812 in FIG. 8. The DPD training component 1140 may be configured to transmit a first signal based on the calculated one or more DPD parameters, e.g., as described in connection with 708 in FIG. 7 and 814 in FIG. 8.

The apparatus may include additional components that perform each of the blocks of the algorithm in the flowcharts of FIGS. 6-8. As such, each block in the flowcharts of FIGS. 6-8 may be performed by a component and the apparatus may include one or more of those components. The components may be one or more hardware components specifically configured to carry out the stated processes/algorithm, implemented by a processor configured to perform the stated processes/algorithm, stored within a computer-readable medium for implementation by a processor, or some combination thereof.

As shown, the apparatus 1102 may include a variety of components configured for various functions. In one configuration, the apparatus 1102, and in particular the cellular baseband processor 1104, includes means for transmitting, to a second subset of one or more second UEs, one or more pilot signals associated with DPD training. The apparatus 1102, and in particular the cellular baseband processor 1104, includes means for receiving, from a third subset of the one or more second UEs, one or more feedback messages associated with DPD training. The one or more feedback messages may be based on the one or more pilot signals. Each second UE in the third subset of the one or more second UEs may correspond to one of the one or more feedback messages. The apparatus 1102, and in particular the cellular baseband processor 1104, includes means for calculating one or more DPD parameters based on the one or more feedback messages. The apparatus 1102, and in particular the cellular baseband processor 1104, includes means for transmitting a first signal based on the calculated one or more DPD parameters.

In one configuration, the apparatus 1102, and in particular the cellular baseband processor 1104, includes means for transmitting, to at least one other UE via a first broadcast message, a capability exchange message. The capability exchange message may include a DPD capability indication. In one configuration, the capability exchange message may further include a DPD training capability indication. The DPD training capability indication may include at least one of bandwidth restriction information or an indication of a number of kernels. In one configuration, the apparatus 1102, and in particular the cellular baseband processor 1104, includes means for transmitting, to the one or more second UEs via a second broadcast message, a DPD training request message. The apparatus 1102, and in particular the cellular baseband processor 1104, includes means for receiving, from a first subset of the one or more second UEs, one or more request acknowledgement messages. Each second UE in the first subset of the one or more second UEs may correspond to one of the one or more request acknowledgement messages. In one configuration, the DPD training request message may include at least one of one or more DPD training parameters, DMRS information, or request acknowledgement message information. The one or more DPD training parameters may include at least one of a list of kernels or prioritization information associated with one or more frequency bands. In one configuration, the DPD training request message may be transmitted a plurality of times. In one configuration, the one or more request acknowledgement messages may be received via a same set of time-frequency resources. In one configuration, each of the one or more request acknowledgement messages may be received via a respective set of time-frequency resources associated with the corresponding second UE. In one configuration, at least one of the one or more request acknowledgement messages may include at least one of training capability information associated with the corresponding second UE or a signal quality indication associated with a signal from the first UE to the corresponding second UE. In one configuration, the one or more request acknowledgement messages may be received via a plurality of sets of time-frequency resources. Each set of the plurality of sets of time-frequency resources may be associated with one of a plurality of training categories. In one configuration, the one or more pilot signals may correspond to one or more NLRSs or one or more DMRSs. In one configuration, the one or more pilot signals may be associated with a slot. The slot may be associated with at least one other pilot signal from at least one other first UE. In one configuration, the one or more feedback messages may correspond to a cross-correlation or an autocorrelation of a list of kernels.

The means may be one or more of the components of the apparatus 1102 configured to perform the functions recited by the means. As described supra, the apparatus 1102 may include the TX Processor 368, the RX Processor 356, and the controller/processor 359. As such, in one configuration, the means may be the TX Processor 368, the RX Processor 356, and the controller/processor 359 configured to perform the functions recited by the means.

Figure 12:
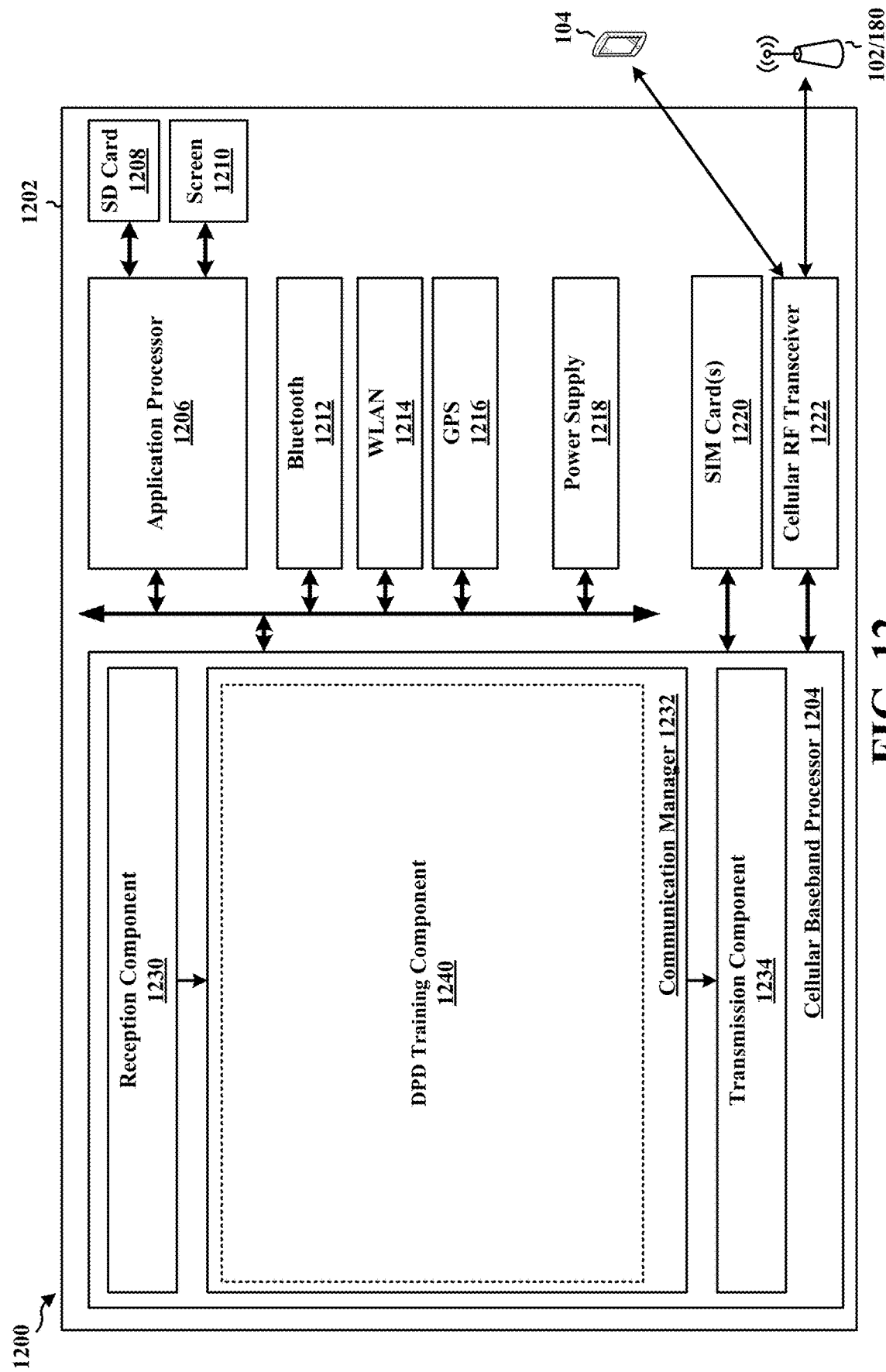
FIG. 12 is a diagram illustrating an example of a hardware implementation for an example apparatus.

FIG. 12 is a diagram 1200 illustrating an example of a hardware implementation for an apparatus 1202. The apparatus 1202 may be a second UE, a component of a second UE, or may implement second UE functionality. In some aspects, the apparatus 1202 may include a cellular baseband processor 1204 (also referred to as a modem) coupled to a cellular RF transceiver 1222. In some aspects, the apparatus 1202 may further include one or more subscriber identity modules (SIM) cards 1220, an application processor 1206 coupled to a secure digital (SD) card 1208 and a screen 1210, a Bluetooth module 1212, a wireless local area network (WLAN) module 1214, a Global Positioning System (GPS) module 1216, or a power supply 1218. The cellular baseband processor 1204 communicates through the cellular RF transceiver 1222 with the UE 104 and/or BS 102/180. The cellular baseband processor 1204 may include a computer-readable medium/memory. The computer-readable medium/memory may be non-transitory. The cellular baseband processor 1204 is responsible for general processing, including the execution of software stored on the computer-readable medium/memory. The software, when executed by the cellular baseband processor 1204, causes the cellular baseband processor 1204 to perform the various functions described supra. The computer-readable medium/memory may also be used for storing data that is manipulated by the cellular baseband processor 1204 when executing software. The cellular baseband processor 1204 further includes a reception component 1230, a communication manager 1232, and a transmission component 1234. The communication manager 1232 includes the one or more illustrated components. The components within the communication manager 1232 may be stored in the computer-readable medium/memory and/or configured as hardware within the cellular baseband processor 1204. The cellular baseband processor 1204 may be a component of the UE 350 and may include the memory 360 and/or at least one of the TX processor 368, the RX processor 356, and the controller/processor 359. In one configuration, the apparatus 1202 may be a modem chip and include just the baseband processor 1204, and in another configuration, the apparatus 1202 may be the entire UE (e.g., see 350 of FIG. 3) and include the additional modules of the apparatus 1202.

The communication manager 1232 includes a DPD training component 1240 that may be configured to transmit, to at least one other UE via a first broadcast message, a capability exchange message, e.g., as described in connection with 1002 in FIG. 10. The DPD training component 1240 may be configured to receive, from at least one first UE via a second broadcast message, a DPD training request message, e.g., as described in connection with 902 in FIG. 9 and 1004 in FIG. 10. The DPD training component 1240 may be configured to transmit, to the at least one first UE, a request acknowledgement message, e.g., as described in connection with 904 in FIG. 9 and 1006 in FIG. 10. The DPD training component 1240 may be configured to receive, from the at least one first UE, one or more pilot signals associated with DPD training, e.g., as described in connection with 906 in FIG. 9 and 1008 in FIG. 10. The DPD training component 1240 may be configured to transmit, to the at least one first UE, a feedback message associated with DPD training based on the one or more pilot signals, e.g., as described in connection with 908 in FIG. 9 and 1010 in FIG. 10.

The apparatus may include additional components that perform each of the blocks of the algorithm in the flowcharts of FIGS. 6, 9, and 10. As such, each block in the flowcharts of FIGS. 6, 9, and 10 may be performed by a component and the apparatus may include one or more of those components. The components may be one or more hardware components specifically configured to carry out the stated processes/algorithm, implemented by a processor configured to perform the stated processes/algorithm, stored within a computer-readable medium for implementation by a processor, or some combination thereof.

As shown, the apparatus 1202 may include a variety of components configured for various functions. In one configuration, the apparatus 1202, and in particular the cellular baseband processor 1204, includes means for receiving, from at least one first UE via a second broadcast message, a DPD training request message. The apparatus 1202, and in particular the cellular baseband processor 1204, includes means for transmitting, to the at least one first UE, a request acknowledgement message. The apparatus 1202, and in particular the cellular baseband processor 1204, includes means for receiving, from the at least one first UE, one or more pilot signals associated with DPD training. The apparatus 1202, and in particular the cellular baseband processor 1204, includes means for transmitting, to the at least one first UE, a feedback message associated with DPD training based on the one or more pilot signals.

In one configuration, the apparatus 1202, and in particular the cellular baseband processor 1204, includes means for transmitting, to at least one other UE via a first broadcast message, a capability exchange message. The capability exchange message may include a DPD training capability indication. The DPD training capability indication may include at least one of bandwidth restriction information or an indication of a number of kernels. In one configuration, the capability exchange message may further include a DPD capability indication. In one configuration, the DPD training request message may include at least one of one or more DPD training parameters, DMRS information, or request acknowledgement message information. The one or more DPD training parameters may include at least one of a list of kernels or prioritization information associated with one or more frequency bands. In one configuration, the DPD training request message may be received a plurality of times. In one configuration, the request acknowledgement message may be transmitted via a set of time-frequency resources. The set of time-frequency resources may be associated with at least one other request acknowledgement message from at least one other second UE. In one configuration, the set of time-frequency resources may be associated with one of a plurality of training categories. In one configuration, the request acknowledgement message may be transmitted via a set of time-frequency resources associated with the second UE. In one configuration, the request acknowledgement message may include at least one of training capability information associated with the second UE or a signal quality indication associated with a signal from the at least one first UE to the second UE. In one configuration, the one or more pilot signals may correspond to one or more NLRSs or one or more DMRSs. In one configuration, the one or more pilot signals may be associated with a slot. The slot may be associated with at least one other pilot signal from at least one other first UE. In one configuration, the feedback message may correspond to a cross-correlation or an auto-correlation of a list of kernels.

The means may be one or more of the components of the apparatus 1202 configured to perform the functions recited by the means. As described supra, the apparatus 1202 may include the TX Processor 368, the RX Processor 356, and the controller/processor 359. As such, in one configuration, the means may be the TX Processor 368, the RX Processor 356, and the controller/processor 359 configured to perform the functions recited by the means.

Referring back to FIGS. 4-12, a first UE may transmit, to a second subset of one or more second UEs, one or more pilot signals associated with DPD training. The first UE may receive, from a third subset of the one or more second UEs. One or more feedback messages may be associated with DPD training. The one or more feedback messages may be based on the one or more pilot signals. Each second UE in the third subset of the one or more second UEs may correspond to one of the one or more feedback messages. The second UE may calculate one or more DPD parameters based on the one or more feedback messages. The second UE may transmit a first signal based on the calculated one or more DPD parameters. Accordingly, in a D2D communication system, DPD coefficients associated with a transmitting UE may be trained OTA based on results received from one or more assisting UEs. They transmitting UE may apply the trained DPD coefficients to correct for PA non-linearity.

It is understood that the specific order or hierarchy of blocks in the processes/flowcharts disclosed is an illustration of example approaches. Based upon design preferences, it is understood that the specific order or hierarchy of blocks in the processes/flowcharts may be rearranged. Further, some blocks may be combined or omitted. The accompanying method claims present elements of the various blocks in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Terms such as "if," "when," and "while" should be interpreted to mean "under the condition that" rather than imply an immediate temporal relationship or reaction. That is, these phrases, e.g., "when," do not imply an immediate action in response to or during the occurrence of an action, but simply imply that if a condition is met then an action will occur, but without requiring a specific or immediate time constraint for the action to occur. The word "exemplary" is used herein to mean "serving as an example, instance, or illustration." Any aspect described herein as "exemplary" is not necessarily to be construed as preferred or advantageous over other aspects. Unless specifically stated otherwise, the term "some" refers to one or more. Combinations such as "at least one of A, B, or C," "one or more of A, B, or C," "at least one of A, B, and C," "one or more of A, B, and C," and "A, B, C, or any combination thereof" include any combination of A, B, and/or C, and may include multiples of A, multiples of B, or multiples of C. Specifically, combinations such as "at least one of A, B, or C," "one or more of A, B, or C," "at least one of A, B, and C," "one or more of A, B, and C," and "A, B, C, or any combination thereof" may be A only, B only, C only, A and B, A and C, B and C, or A and B and C, where any such combinations may contain one or more member or members of A, B, or C. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. The words "module," "mechanism," "element," "device," and the like may not be a substitute for the word "means." As such, no claim element is to be construed as a means plus function unless the element is expressly recited using the phrase "means for."

The following aspects are illustrative only and may be combined with other aspects or teachings described herein, without limitation.

Aspect 1 is an apparatus for wireless communication at a first UE including at least one processor coupled to a memory and configured to transmit, to a second subset of one or more second UEs, one or more pilot signals associated with digital DPD training; receive, from a third subset of the one or more second UEs, one or more feedback messages associated with DPD training, the one or more feedback messages being based on the one or more pilot signals, each second UE in the third subset of the one or more second UEs corresponding to one of the one or more feedback messages; calculate one or more DPD parameters based on the one or more feedback messages; and transmit a first signal based on the calculated one or more DPD parameters.

Aspect 2 is the apparatus of aspect 1, the at least one processor being further configured to: transmit, to at least one other UE via a first broadcast message, a capability exchange message, the capability exchange message including a DPD capability indication.

Aspect 3 is the apparatus of aspect 2, where the capability exchange message further includes a DPD training capability indication, and the DPD training capability indication includes at least one of bandwidth restriction information or an indication of a number of kernels.

Aspect 4 is the apparatus of any of aspects 1 to 3, the at least one processor being further configured to: transmit, to the one or more second UEs via a second broadcast message, a DPD training request message; and receive, from a first subset of the one or more second UEs, one or more request acknowledgement messages, each second UE in the first subset of the one or more second UEs corresponding to one of the one or more request acknowledgement messages.

Aspect 5 is the apparatus of aspect 4, where the DPD training request message includes at least one of one or more DPD training parameters, DMRS information, or request acknowledgement message information, and the one or more DPD training parameters include at least one of a list of kernels or prioritization information associated with one or more frequency bands.

Aspect 6 is the apparatus of any of aspects 4 to 5, where the DPD training request message is transmitted a plurality of times.

Aspect 7 is the apparatus of any of aspects 4 to 6, where the one or more request acknowledgement messages are received via a same set of time-frequency resources.

Aspect 8 is the apparatus of any of aspects 4 to 7, where each of the one or more request acknowledgement messages is received via a respective set of time-frequency resources associated with the corresponding second UE.

Aspect 9 is the apparatus of aspect 8, where at least one of the one or more request acknowledgement messages includes at least one of training capability information associated with the corresponding second UE or a signal quality indication associated with a signal from the first UE to the corresponding second UE.

Aspect 10 is the apparatus of any of aspects 4 to 7, where the one or more request acknowledgement messages are received via a plurality of sets of time-frequency resources, and each set of the plurality of sets of time-frequency resources is associated with one of a plurality of training categories.

Aspect 11 is the apparatus of any of aspects 1 to 10, where the one or more pilot signals correspond to one or more NLRSs or one or more DMRSs.

Aspect 12 is the apparatus of any of aspects 1 to 11, where the one or more pilot signals are associated with a slot, and the slot is associated with at least one other pilot signal from at least one other first UE.

Aspect 13 is the apparatus of any of aspects 1 to 12, where the one or more feedback messages correspond to a cross-correlation or an autocorrelation of a list of kernels.

Aspect 14 is the apparatus of any of aspects 1 to 13, further including a transceiver coupled to the at least one processor.

Aspect 15 is an apparatus for wireless communication at a second UE including at least one processor coupled to a memory and configured to receive, from at least one first UE via a second broadcast message, a DPD training request message; transmit, to the at least one first UE, a request acknowledgement message; receive, from the at least one first UE, one or more pilot signals associated with DPD training; and transmit, to the at least one first UE, a feedback message associated with DPD training based on the one or more pilot signals.

Aspect 16 is the apparatus of aspect 15, the at least one processor being further configured to: transmit, to at least one other UE via a first broadcast message, a capability exchange message, the capability exchange message including a DPD training capability indication, the DPD training capability indication including at least one of bandwidth restriction information or an indication of a number of kernels.

Aspect 17 is the apparatus of aspect 16, where the capability exchange message further includes a DPD capability indication.

Aspect 18 is the apparatus of any of aspects 15 to 17, where the DPD training request message includes at least one of one or more DPD training parameters, DMRS information, or request acknowledgement message information, and the one or more DPD training parameters include at least one of a list of kernels or prioritization information associated with one or more frequency bands.

Aspect 19 is the apparatus of any of aspects 15 to 18, where the DPD training request message is received a plurality of times.

Aspect 20 is the apparatus of any of aspects 15 to 19, where the request acknowledgement message is transmitted via a set of time-frequency resources, and the set of time-frequency resources is associated with at least one other request acknowledgement message from at least one other second UE.

Aspect 21 is the apparatus of aspect 20, where the set of time-frequency resources is associated with one of a plurality of training categories.

Aspect 22 is the apparatus of any of aspects 15 to 19, where the request acknowledgement message is transmitted via a set of time-frequency resources associated with the second UE.

Aspect 23 is the apparatus of aspect 22, where the request acknowledgement message includes at least one of training capability information associated with the second UE or a signal quality indication associated with a signal from the at least one first UE to the second UE.

Aspect 24 is the apparatus of any of aspects 15 to 23, where the one or more pilot signals correspond to one or more NLRSs or one or more DMRSs.

Aspect 25 is the apparatus of any of aspects 15 to 24, where the one or more pilot signals are associated with a slot, and the slot is associated with at least one other pilot signal from at least one other first UE.

Aspect 26 is the apparatus of any of aspects 15 to 25, where the feedback message corresponds to a cross-correlation or an autocorrelation of a list of kernels.

Aspect 27 is the apparatus of any of aspects 15 to 26, further including a transceiver coupled to the at least one processor.

Aspect 28 is a method of wireless communication for implementing any of aspects 1 to 27.

Aspect 29 is an apparatus for wireless communication including means for implementing any of aspects 1 to 27.

Aspect 30 is a computer-readable medium storing computer executable code, where the code when executed by a processor causes the processor to implement any of aspects 1 to 27.

What is claimed is:

1. An apparatus for wireless communication at a first user equipment (UE), comprising:
    a memory; and
    at least one processor coupled to the memory and configured to:
        transmit, from the first UE, to a second subset of one or more second UEs, one or more pilot signals associated with digital pre-distortion (DPD) training;
        receive, at the first UE, from a third subset of the one or more second UEs, one or more feedback messages associated with DPD training, the one or more feedback messages being based on the one or more pilot signals, each second UE in the third subset of the one or more second UEs corresponding to one of the one or more feedback messages;
        calculate one or more DPD parameters based on the one or more feedback messages; and
        transmit a first signal based on the calculated one or more DPD parameters.

2. The apparatus of claim 1, the at least one processor being further configured to:
    transmit, to at least one other UE via a first broadcast message, a capability exchange message, the capability exchange message comprising a DPD capability indication.

3. The apparatus of claim 2, wherein the capability exchange message further comprises a DPD training capability indication, and the DPD training capability indication comprises at least one of bandwidth restriction information or an indication of a number of kernels.

4. The apparatus of claim 1, the at least one processor being further configured to:
    transmit, to the one or more second UEs via a second broadcast message, a DPD training request message; and
    receive, from a first subset of the one or more second UEs, one or more request acknowledgement messages, each second UE in the first subset of the one or more second UEs corresponding to one of the one or more request acknowledgement messages.

5. The apparatus of claim 4, wherein the DPD training request message comprises at least one of one or more DPD training parameters, demodulation reference signal (DMRS) information, or request acknowledgement message information, and the one or more DPD training parameters comprise at least one of a list of kernels or prioritization information associated with one or more frequency bands.

6. The apparatus of claim 4, wherein the DPD training request message is transmitted a plurality of times.

7. The apparatus of claim 4, wherein the one or more request acknowledgement messages are received via a same set of time-frequency resources.

8. The apparatus of claim 4, wherein each of the one or more request acknowledgement messages is received via a respective set of time-frequency resources associated with the corresponding second UE.

9. The apparatus of claim 8, wherein at least one of the one or more request acknowledgement messages includes at least one of training capability information associated with the corresponding second UE or a signal quality indication associated with a signal from the first UE to the corresponding second UE.

10. The apparatus of claim 4, wherein the one or more request acknowledgement messages are received via a plurality of sets of time-frequency resources, and each set of the plurality of sets of time-frequency resources is associated with one of a plurality of training categories.

11. The apparatus of claim 1, wherein the one or more pilot signals correspond to one or more non-linearity reference signals (NLRSs) or one or more demodulation reference signals (DMRSs).

12. The apparatus of claim 1, wherein the one or more pilot signals are associated with a slot, and the slot is associated with at least one other pilot signal from at least one other first UE.

13. The apparatus of claim 1, wherein the one or more feedback messages correspond to a cross-correlation or an autocorrelation of a list of kernels.

14. The apparatus of claim 1, further comprising a transceiver coupled to the at least one processor.

15. A method of wireless communication at a first user equipment (UE), comprising:
    transmitting, from the first UE, to a second subset of one or more second UEs, one or more pilot signals associated with digital pre-distortion (DPD) training;
    receiving, at the first UE, from a third subset of the one or more second UEs, one or more feedback messages associated with DPD training, the one or more feedback messages being based on the one or more pilot signals, each second UE in the third subset of the one or more second UEs corresponding to one of the one or more feedback messages;
    calculating one or more DPD parameters based on the one or more feedback messages; and
    transmitting a first signal based on the calculated one or more DPD parameters.

16. An apparatus for wireless communication at a second user equipment (UE), comprising:
    a memory; and
    at least one processor coupled to the memory and configured to:
        receive, from at least one first UE via a second broadcast message, a digital pre-distortion (DPD) training request message;
        transmit, to the at least one first UE, a request acknowledgement message;
        receive, from the at least one first UE, one or more pilot signals associated with DPD training; and
        transmit, to the at least one first UE, a feedback message associated with DPD training based on the one or more pilot signals.

17. The apparatus of claim 16, the at least one processor being further configured to:
    transmit, to at least one other UE via a first broadcast message, a capability exchange message, the capability exchange message comprising a DPD training capability indication, the DPD training capability indication comprising at least one of bandwidth restriction information or an indication of a number of kernels.

18. The apparatus of claim 17, wherein the capability exchange message further comprises a DPD capability indication.

19. The apparatus of claim 16, wherein the DPD training request message comprises at least one of one or more DPD training parameters, demodulation reference signal (DMRS) information, or request acknowledgement message information, and the one or more DPD training parameters comprise at least one of a list of kernels or prioritization information associated with one or more frequency bands.

20. The apparatus of claim 16, wherein the DPD training request message is received a plurality of times.

21. The apparatus of claim 16, wherein the request acknowledgement message is transmitted via a set of time-frequency resources, and the set of time-frequency resources is associated with at least one other request acknowledgement message from at least one other second UE.

22. The apparatus of claim 21, wherein the set of time-frequency resources is associated with one of a plurality of training categories.

23. The apparatus of claim 16, wherein the request acknowledgement message is transmitted via a set of time-frequency resources associated with the second UE.

24. The apparatus of claim 23, wherein the request acknowledgement message includes at least one of training capability information associated with the second UE or a signal quality indication associated with a signal from the at least one first UE to the second UE.

25. The apparatus of claim 16, wherein the one or more pilot signals correspond to one or more non-linearity reference signals (NLRSs) or one or more demodulation reference signals (DMRSs).

26. The apparatus of claim 16, wherein the one or more pilot signals are associated with a slot, and the slot is associated with at least one other pilot signal from at least one other first UE.

27. The apparatus of claim 16, wherein the feedback message corresponds to a cross-correlation or an autocorrelation of a list of kernels.

28. The apparatus of claim 16, further comprising a transceiver coupled to the at least one processor.

29. A method of wireless communication at a second user equipment (UE), comprising:
  receiving, from at least one first UE via a second broadcast message, a digital pre-distortion (DPD) training request message;
  transmitting, to the at least one first UE, a request acknowledgement message;
  receiving, from the at least one first UE, one or more pilot signals associated with DPD training; and
  transmitting, to the at least one first UE, a feedback message associated with DPD training based on the one or more pilot signals.

30. The method of claim 29, further comprising:
  transmitting, to at least one other UE via a first broadcast message, a capability exchange message, the capability exchange message comprising a DPD training capability indication, the DPD training capability indication comprising at least one of bandwidth restriction information or an indication of a number of kernels.

* * * * *